United States Patent
Kim et al.

(10) Patent No.: US 9,318,335 B2
(45) Date of Patent: Apr. 19, 2016

(54) METHOD FOR FABRICATING SEMICONDUCTOR DEVICE INCLUDING NITRIDED GATE INSULATOR

(71) Applicants: Weon-Hong Kim, Suwon-si (KR); Moon-Kyun Song, Anyang-si (KR); Min-Joo Lee, Seoul (KR); Hyung-Suk Jung, Suwon-si (KR)

(72) Inventors: Weon-Hong Kim, Suwon-si (KR); Moon-Kyun Song, Anyang-si (KR); Min-Joo Lee, Seoul (KR); Hyung-Suk Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/685,618

(22) Filed: Apr. 14, 2015

(65) Prior Publication Data
US 2016/0064225 A1     Mar. 3, 2016

(30) Foreign Application Priority Data
Sep. 1, 2014   (KR) .................. 10-2014-0115483

(51) Int. Cl.
*H01L 21/28* (2006.01)
*H01L 29/51* (2006.01)

(52) U.S. Cl.
CPC .... *H01L 21/28158* (2013.01); *H01L 21/28079* (2013.01); *H01L 29/511* (2013.01)

(58) Field of Classification Search
CPC ............ H01L 21/285; H01L 21/28518; H01L 29/517; H01L 29/518; H01L 29/772; H01L 21/336
See application file for complete search history.

(56) References Cited

U.S. PATENT DOCUMENTS

| | | | |
|---|---|---|---|
| 7,381,608 B2 | 6/2008 | Brask et al. | |
| 7,807,990 B2 | 10/2010 | Koyama et al. | |
| 8,304,841 B2 | 11/2012 | Xu et al. | |
| 8,440,559 B2 | 5/2013 | Lenski et al. | |
| 8,643,115 B2 | 2/2014 | Chudzik et al. | |
| 2006/0257563 A1* | 11/2006 | Doh ...................... | C23C 16/401 427/248.1 |
| 2007/0072364 A1 | 3/2007 | Visokay et al. | |
| 2007/0212896 A1* | 9/2007 | Olsen ................ | H01J 37/32082 438/758 |
| 2012/0241874 A1 | 9/2012 | Kim et al. | |
| 2013/0056836 A1* | 3/2013 | Yu ................... | H01L 21/823807 257/410 |
| 2013/0244412 A1 | 9/2013 | Pan et al. | |
| 2013/0260549 A1 | 10/2013 | Jagannathan et al. | |
| 2013/0316525 A1 | 11/2013 | Son et al. | |

FOREIGN PATENT DOCUMENTS

JP         2007142266         6/2007

* cited by examiner

*Primary Examiner* — Selim Ahmed
(74) *Attorney, Agent, or Firm* — Volentine & Whitt, PLLC

(57) ABSTRACT

A method of fabricating a semiconductor device includes forming an interface layer on a substrate, forming a first gate insulating layer having a first dielectric constant on the interface layer, forming a second gate insulating layer having a second dielectric constant smaller than the first dielectric constant on the first gate insulating layer, annealing the substrate, nitriding a resultant of the annealed first and second gate insulating layers to form a nitrided gate insulator, forming a work function control layer on the nitride gate insulator, and forming a metal gate electrode on the work function control layer. At least one of the work function control layer and the metal gate electrode is of or includes aluminum (Al).

19 Claims, 30 Drawing Sheets

<u>14</u>

1200

1300

1400

METHOD FOR FABRICATING SEMICONDUCTOR DEVICE INCLUDING NITRIDED GATE INSULATOR

PRIORITY STATEMENT

This application claims priority from Korean Patent Application No. 10-2014-0115483 filed on Sep. 1, 2014 in the Korean Intellectual Property Office, and all the benefits accruing therefrom under 35 U.S.C. 119, the contents of which are hereby incorporated by reference in their entirety.

BACKGROUND

The inventive concept relates to a method of fabricating a semiconductor device. In particular, the inventive concept relates to the manufacturing of transistors including a gate electrode and a gate dielectric interposed between the gate electrode and a channel region of the transistor.

Silicon dioxide has been conventionally used a gate dielectric of a transistor. As semiconductor devices have been miniaturized to meet a demand for more compact electronic products, transistors have become smaller and as a result, the thickness of silicon dioxide gate dielectrics have decreased to increase the gate capacitance and thereby ensure a sufficient device performance. However, decreasing the thickness of a silicon dioxide gate dielectric can allow for leakage current to increase, i.e., can lead to reduced device reliability, for example.

One technique to obviate this problem is to replace the silicon dioxide gate dielectric with high-k dielectric material. High-k dielectrics can be used to produce comparatively higher gate capacitance without the tendency to facilitate leakage current. Research aimed at improving the performance of miniaturized semiconductor devices through the manufacturing of the gate dielectric is still actively ongoing, though.

SUMMARY

According to an aspect of the inventive concept, there is provided a method for fabricating a semiconductor device, the method including forming an interface layer on a substrate, forming a first gate insulating layer having a first dielectric constant on the interface layer, forming a second gate insulating layer having a second dielectric constant smaller than the first dielectric constant on the first gate insulating layer, annealing the substrate, nitriding the first and second gate insulating layers to form a nitride gate insulator, forming a work function control layer on the nitrided gate insulator, and forming a metal gate electrode on the work function control layer, and in which at least one of the work function control layer and the metal gate electrode comprises aluminum (Al).

According to another aspect of the inventive concept, there is provided a method for fabricating a semiconductor device, the method including forming an interface layer on a substrate, forming a first gate insulating layer on the interface layer, forming on the first gate insulating layer a second gate insulating layer having a dielectric constant smaller than that of the first gate insulating layer and including silicon (Si), annealing the substrate, nitriding the gate insulator after annealing the substrate in an atmosphere of a nitride gas, forming a work function control layer on the nitrided gate insulator, and forming a metal gate electrode on the work function control layer.

According to an aspect of the inventive concept, there is provided a method for fabricating a semiconductor device, the method including providing a substrate, forming a first interface layer on the substrate in a first region, forming a second interface layer, having a width different from that of the first interface layer, on the substrate in the second region, forming a first gate insulator doped with silicon (Si) on the first interface layer, forming a second gate insulator doped with silicon (Si) on the second interface layer, annealing the substrate, subsequently nitriding the first gate insulator so that the first gate insulator has a first nitrogen concentration and nitriding the second gate insulator so that the second gate insulator has a second nitrogen concentration different from the first nitrogen concentration, forming a work function control layer on the first and second gate insulators after nitriding the first and second gate insulators, and forming a metal gate electrode on the work function control layer.

According to an aspect of the inventive concept, there is provided a method for fabricating a semiconductor device, the method including forming an interface layer on a substrate, forming a first hafnium oxide layer on the interface layer, forming a first silicon oxide layer on the first hafnium oxide layer, forming a second hafnium oxide layer on the first silicon oxide layer, forming a second silicon oxide layer on the second hafnium oxide layer, subsequently annealing the substrate to form a gate insulator comprising a hafnium oxide layer doped with silicon, and subsequently nitriding the gate insulator in an atmosphere of a nitride gas whose pressure is maintained in a range of 100 millitorr to 500.

The technical objects of the inventive concept are not limited to the aforementioned technical objects, and other technical objects, which are not mentioned above, will be apparent to those skilled in the art from the following description.

BRIEF DESCRIPTION OF THE DRAWINGS

The above and other features and advantages of the inventive concept will become more apparent by describing more specifically embodiments thereof with reference to the attached drawings in which.

DETAILED DESCRIPTION OF THE PREFERRED EMBODIMENTS

Figure 1:
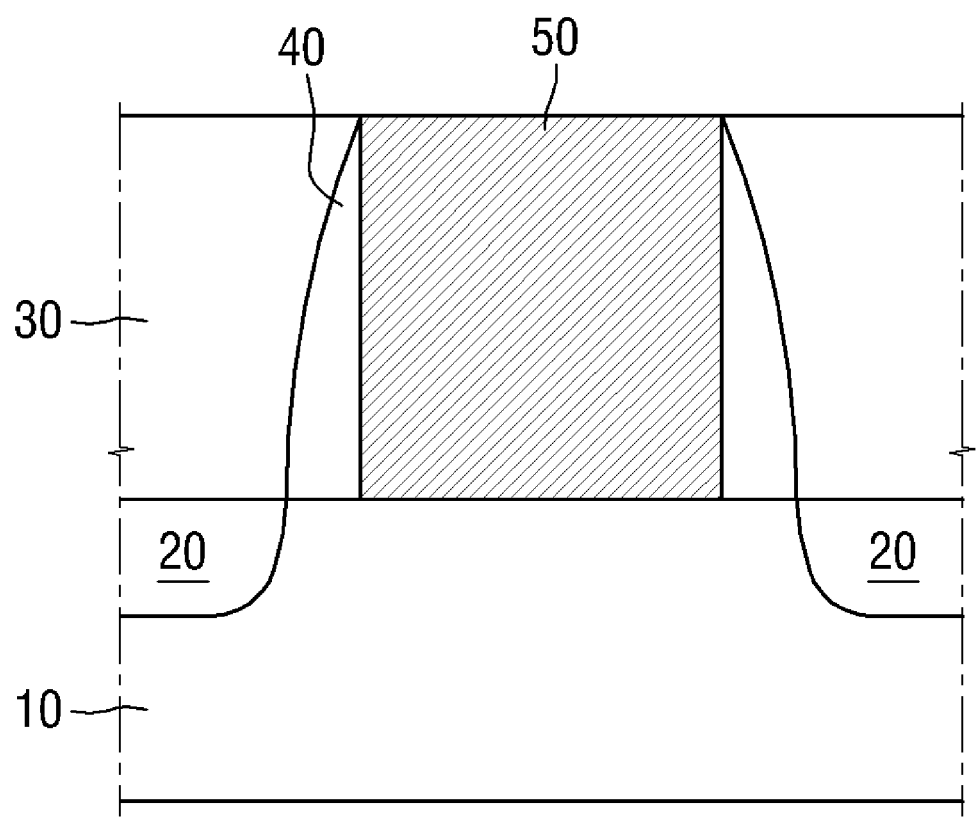
FIGS. 1, 2, 3, 4, 5, 6, and 7 are each a cross-sectional view of a semiconductor device during the course of its manufacture and together illustrate an embodiment of a method of fabricating the device according to the inventive concept.

Advantages and features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the disclosure to those skilled in the art, and the inventive concept will only be defined by the appended claims. Like reference numerals refer to like elements throughout the specification.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which the inventive concept belongs. For example, the term "an oxide" or simply "oxide" (or "a nitride") may be understood, as the context makes clear, as encompassing all oxides (or nitrides) of the element. For example, the term "a silicon oxide" or "silicon oxide" will be understood as including silicon dioxide ($SiO_2$). The term "extending" when used in connection with an element or feature will be understood to generally refer to the lengthwise or longitudinal direction of the element or feature especially in cases in which the disclosure indicates that the element or feature is linear or elongated. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, an embodiment of a method for fabricating a semiconductor device according to the inventive concept will be described with reference to FIGS. 1 to 7.

First, referring to FIG. 1, a dummy gate electrode 50 is formed on a substrate 10.

Although not illustrated more specifically, an isolation layer such as shallow trench isolation (STI) for separating semiconductor devices may be formed in the substrate 10.

The substrate 10 is, for example, a bulk silicon substrate or a silicon-on-insulator (SOI) substrate in which silicon is epitaxially grown on an insulator.

The substrate 10 may include silicon or germanium which is an elemental semiconductor material. Furthermore, the substrate 10 may include a compound semiconductor, and include, for example, a group IV-IV compound semiconductor or a group III-V compound semiconductor. More specifically, in the group IV-IV compound semiconductor, for example, the substrate 10 may include a binary compound and a ternary compound including at least two of carbon (C), silicon (Si), germanium (Ge), and tin (Sn), or a compound in which a group IV element is doped thereto.

In the group III-V compound semiconductor, for example, an epitaxial layer may be one of a binary compound, a ternary compound, or a quaternary compound formed by binding at least one of aluminum (Al), gallium (Ga), and indium (In) as a group III element and one of phosphorus (P), arsenic (As), and antimony (Sb) as a group V element.

Next, for example, the dummy gate electrode 50 including polysilicon is formed on the substrate 10. In addition, spacers 40 including, for example, at least one of a nitride layer and an oxynitride layer are formed at both sides of the dummy gate electrode 50.

In FIG. 1, although the substrate 10 and the dummy gate electrode 50 directly contact each other, the inventive concept is not limited thereto. In some embodiments, a buffer oxide layer may be formed between the substrate 10 and the dummy gate electrode 50.

Further, in some embodiments of the inventive concept, a hard mask including, for example, a silicon nitride layer (SiN) may be formed on the dummy gate electrode 50.

Next, impurities are injected into the substrate 10 by using the dummy gate electrode 50 and the spacer 40 as a mask to form a source-drain region 20.

The source-drain region 20 may be formed through epitaxial growth, unlike those illustrated in the drawing. When the source-drain region 20 is formed through epitaxial growth, the source-drain region 20 may be formed in a recess formed in the substrate 10.

Next, an interlayer insulating layer 30 covering the dummy gate electrode 50 and the spacer 40 is formed. The interlayer insulating layer 30 includes, for example, an oxide layer, a nitride layer, an oxynitride layer, and the like. Subsequently, the interlayer insulating layer 30 is planarized until the surface of the dummy gate electrode 50 is exposed.

Figure 2:
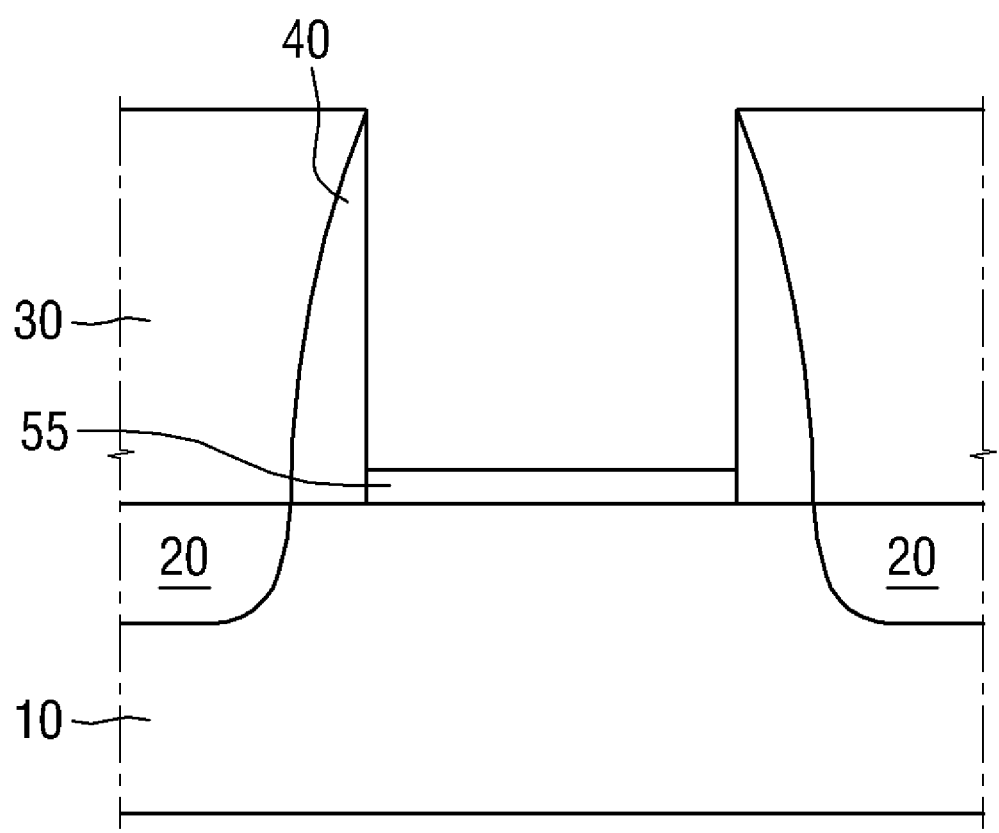

Next, referring to FIG. 2, the dummy gate electrode 50 is removed so that the surface of the substrate 10 is exposed. In addition, an interface layer 55 is formed on the exposed surface of the substrate 10.

In some embodiments of the inventive concept, the interface layer 55 includes, for example, the oxide layer. More specifically, the interface layer 55 includes, for example, a low-dielectric material layer having a dielectric constant (k) of 9 or less such as a silicon oxide layer (k is approximately 4) or a silicon oxynitride layer (k is approximately 4 to 8 depending on contents of an oxygen atom and a nitride atom). Alternatively, the interface layer 55 may be made of, for example, silicate, and may be configured in combination of the above-mentioned layers. In some embodiments of the inventive concept, the interface layer 55 may include a silicon oxide layer ($SiO_2$) formed by heat-oxidizing the substrate 10.

The interface layer 55 may be formed through, for example, a wet process or a heat oxidation scheme. The interface layer 55 may serve to prevent a defective interface between a first gate insulating layer 60a, described below with reference to FIG. 3, and the substrate 10.

Figure 3:
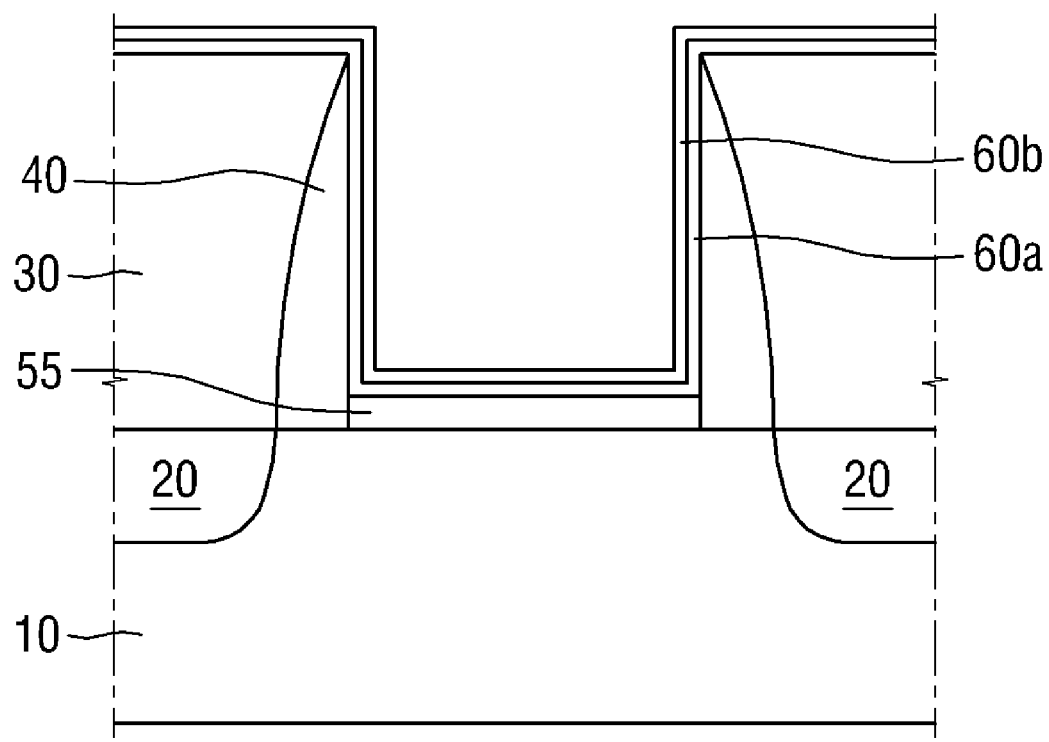

Next, referring to FIG. 3, the first gate insulating layer 60a is formed on the interface layer 55. The first gate insulating layer 60a may include a high-k dielectric material having a dielectric constant higher than that of the silicon oxide layer (for example, a high-k dielectric material having a dielectric constant k of 9 or more).

The first gate insulating layer 60a includes, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or the like.

A second gate insulating layer 60b may be formed on the first gate insulating layer 60a. In some embodiments of the inventive concept, the second gate insulating layer 60b may include a material having a lower dielectric constant than the first gate insulating layer 60a. In some embodiments of the inventive concept, the first gate insulating layer 60a includes, for example, a hafnium oxide layer (HfO), and the second gate insulating layer 60b includes, for example, a silicon oxide layer ($SiO_2$).

The first and second gate insulating layers 60a and 60b may be formed through, for example, atomic layer deposition (ALD). More specifically, the first gate insulating layer 60a may be formed by performing an atomic layer deposition process during n (n is a natural number) cycles, and the second gate insulating layer 60b may be formed by performing the atomic layer deposition process during m (m is a natural number less than n) cycles.

In more detail, the first gate insulating layer 60a may be formed by performing the atomic layer deposition process during 18 cycles, and the second gate insulating layer 60b may be formed by performing the atomic layer deposition process during 1 cycle. However, the inventive concept is not limited to the example, and the processes of forming the first and second insulating layers 60a and 60b may be carried out in numbers of cycles different from those given above.

The first and second gate insulating layers 60a and 60b may be formed to extend upwards along the surface of the interface layer 55 and a side surface of the spacer 40 as illustrated in FIG. 3. Furthermore, the first and second gate insulating layer 60a and 60b may be formed even on the interlayer insulating layer 30.

Figure 4:
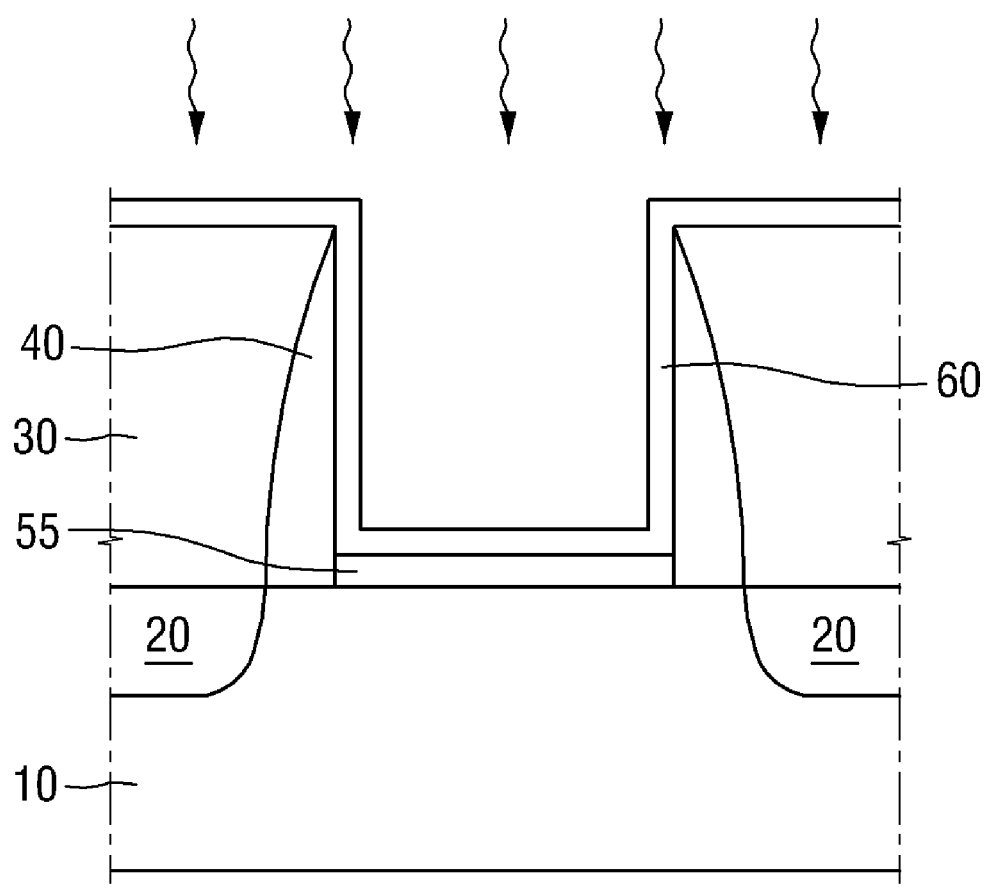

Next, referring to FIG. 4, the substrate 10 is annealed.

In some embodiments of the inventive concept, the annealing includes, for example, flash annealing, spike annealing, or laser annealing. In this case, an annealing temperature is, for example, 800 to 1200° C.

In some embodiments of the inventive concept, the first and second gate insulating layers 60a and 60b may be melded by the annealing process to form a third gate insulating layer 60. The third gate insulating layer 60 includes, for example, a hafnium oxide layer doped with silicon (Si doped HfO), but the inventive concept is not limited thereto.

In other embodiments of the inventive concept, the first and second gate insulating layers 60a and 60b are not melded by the annealing process. That is, even after the annealing process, the first gate insulating layer 60a and the second gate insulating layer 60b may remain discrete from each other.

Figure 5:
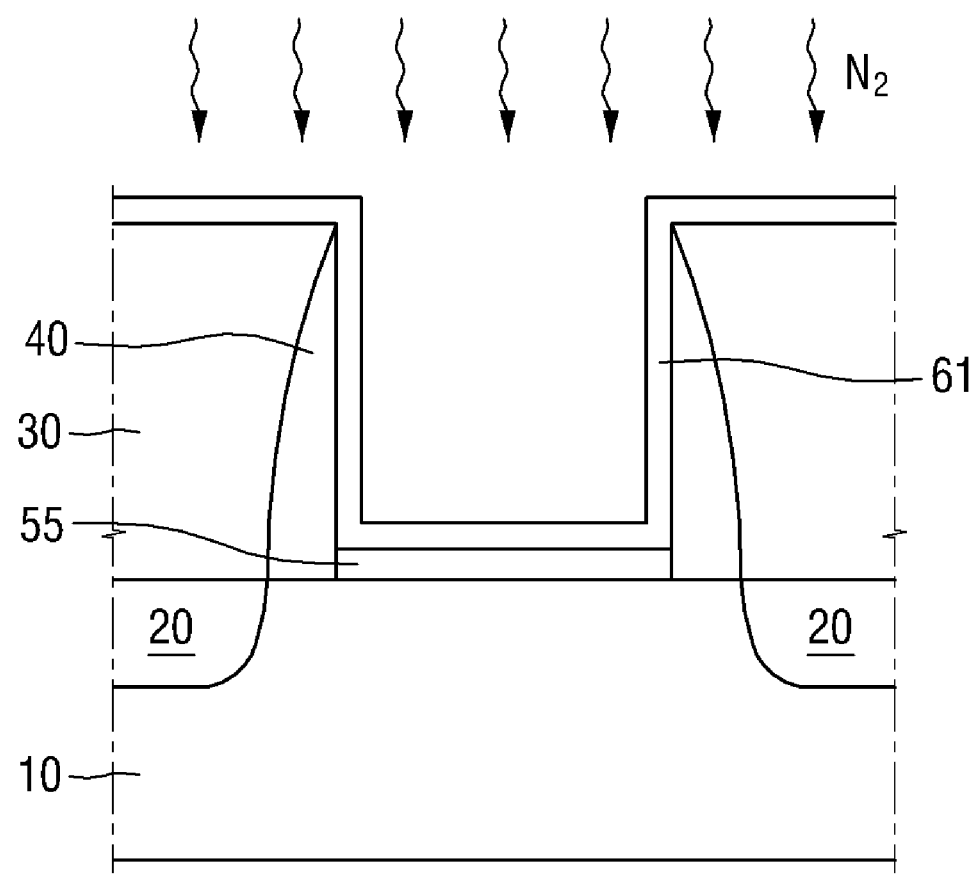

Next, referring to FIG. 5, the first and second gate insulating layers 60a and 60b or the third gate insulating layer 60 are nitrided.

The first and second gate insulating layers 60a and 60b or the third gate insulating layer 60 in FIG. 4 are/is formed into a fourth gate insulating layer 61 by the nitridation process. The fourth gate insulating layer 61 includes, for example, a nitrided hafnium oxide layer doped with silicon (Si doped HfON), but the inventive concept is not limited thereto.

In some embodiments of the inventive concept, the nitridation process is performed under, for example, a high-pressure condition. More specifically, the nitridation process includes, for example, nitriding the first and second gate insulating layers 60a and 60b or the third gate insulating layer 60 by maintaining the pressure of nitride gas at 100 to 500 mm torr.

The nitridation process is performed under such a high-pressure condition so that a peak of a concentration profile of nitrogen in the fourth gate insulating layer 61 is located adjacent to the surface of the fourth gate insulating layer 61. When the peak of the concentration profile of the nitrogen is located on the surface of the fourth gate insulating layer 61, characteristics of the semiconductor element may be improved. A detailed description thereof will be made below.

Figure 6:
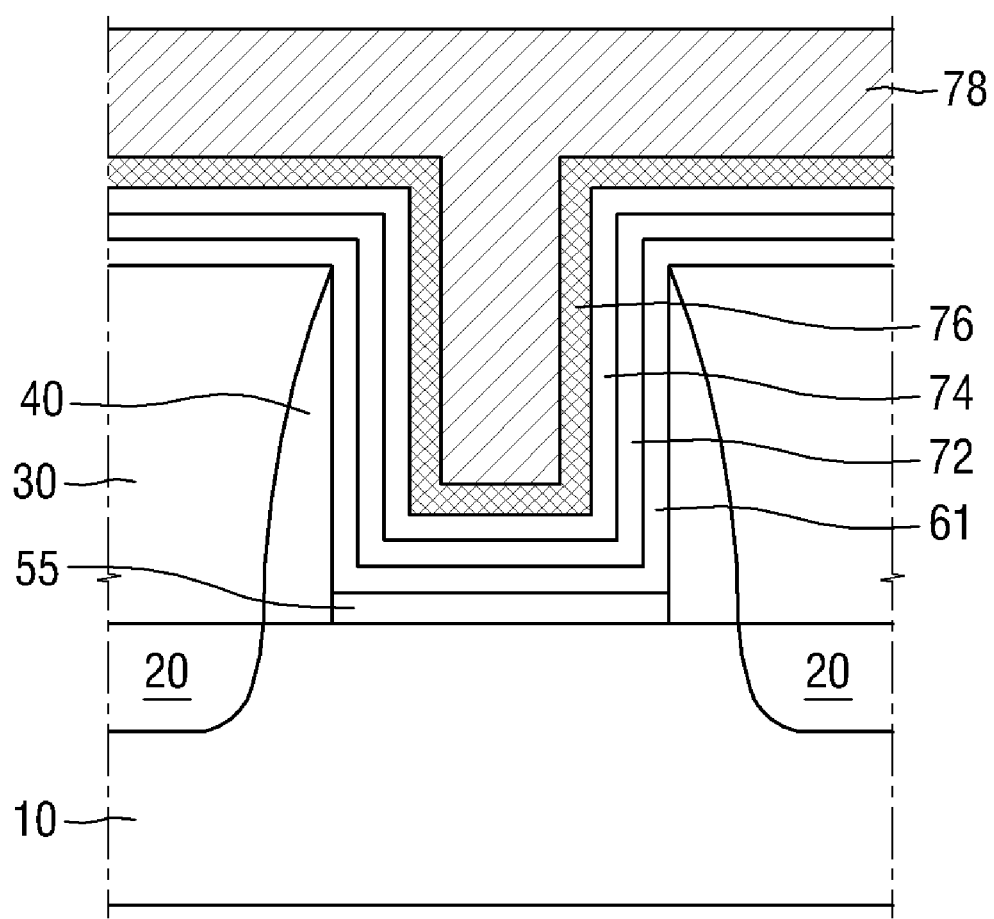

Next, referring to FIG. 6, a capping layer 72 is formed on the fourth gate insulating layer 61.

In some embodiments of the inventive concept, the capping layer 72 includes, for example, a metal nitride layer. More specifically, the capping layer 72 includes, for example, TiN, but the inventive concept is not limited thereto.

The capping layer 72 may serve to control the concentration of oxygen in the fourth gate insulating layer 61 disposed therebelow.

Next, a barrier layer 74 is formed on the capping layer 72.

In some embodiments of the inventive concept, the barrier layer 74 includes, for example, a metal nitride layer. More specifically, the barrier layer 74 includes, for example, TaN, but the inventive concept is not limited thereto.

Subsequently, a work function control layer 76 is formed on the barrier layer 74.

The work function control layer 76 may serve to control a work function of the semiconductor element.

For example, when the semiconductor element is an n type, the work function control layer 76 may include an n-type work function material. Examples of the n-type work function material include TiAl, TiAlN, TaC, TaAlN, TiC, and HfSi, but the inventive concept is not limited thereto.

On the other hand, when the semiconductor element is a p type, the work function control layer 76 may include a p-type work function material. Examples of the p-type work function material include TiN and TaN. More specifically, examples of the p-type work function control layer are a single layer of TiN, and a dual layer constituted by a TiN lower layer and a TaN upper layer, but the inventive concept is not limited thereto.

In some embodiments of the inventive concept, when the semiconductor element is the p type, the work function control layer 76 may be formed in a dual-layer structure constituted by a lower p-type work function control layer and an upper n-type work function control layer.

Subsequently, a metal gate electrode 78 is formed on the work function control layer 76. The metal gate electrode 78 may be formed to fill a trench defined by the work function control layer 76.

In some embodiments of the inventive concept, the metal gate electrode 78 may include metal having high conductivity. Examples of the metal include Al and W, but the inventive concept is not limited thereto.

In some embodiments of the inventive concept, at least one of the work function control layer 76 and the metal gate electrode 78 includes aluminum (Al).

Figure 7:
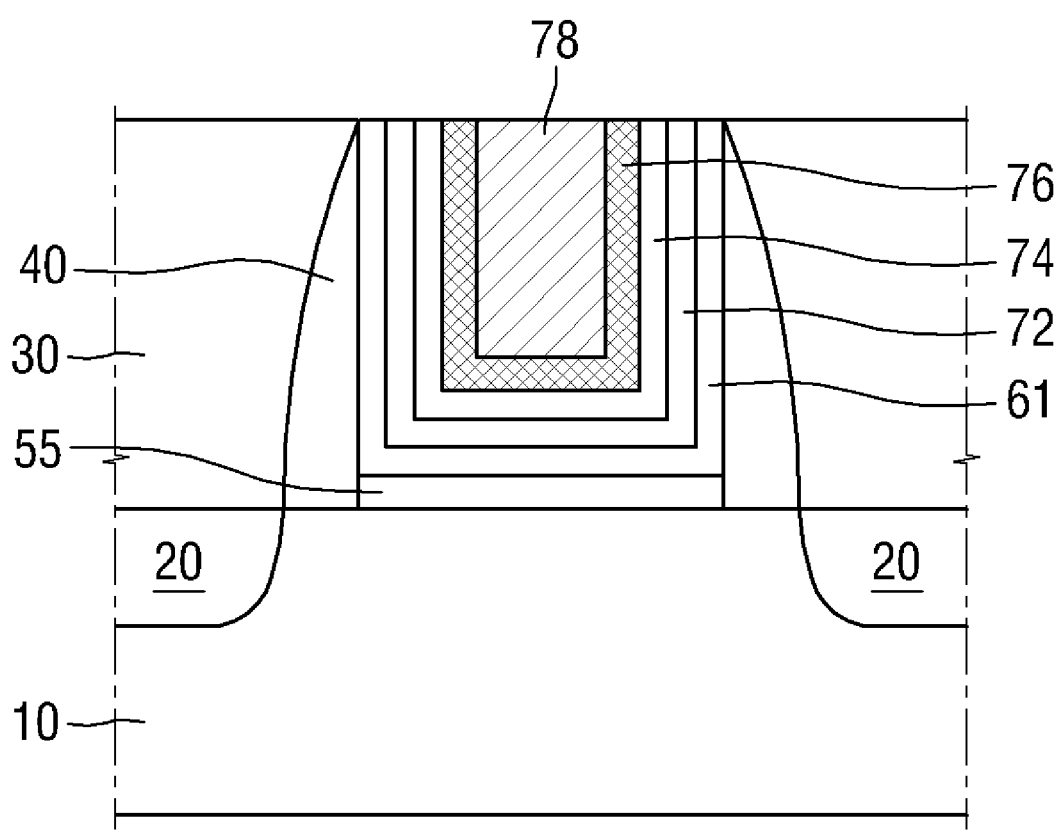

Next, referring to FIG. 7, the metal gate electrode 78 is planarized until the surface of the work function control layer 76 is exposed.

The bather layer 74, the capping layer 72, and the surface of the fourth gate insulating layer 61 may be together exposed by the planarization process.

Figure 8:
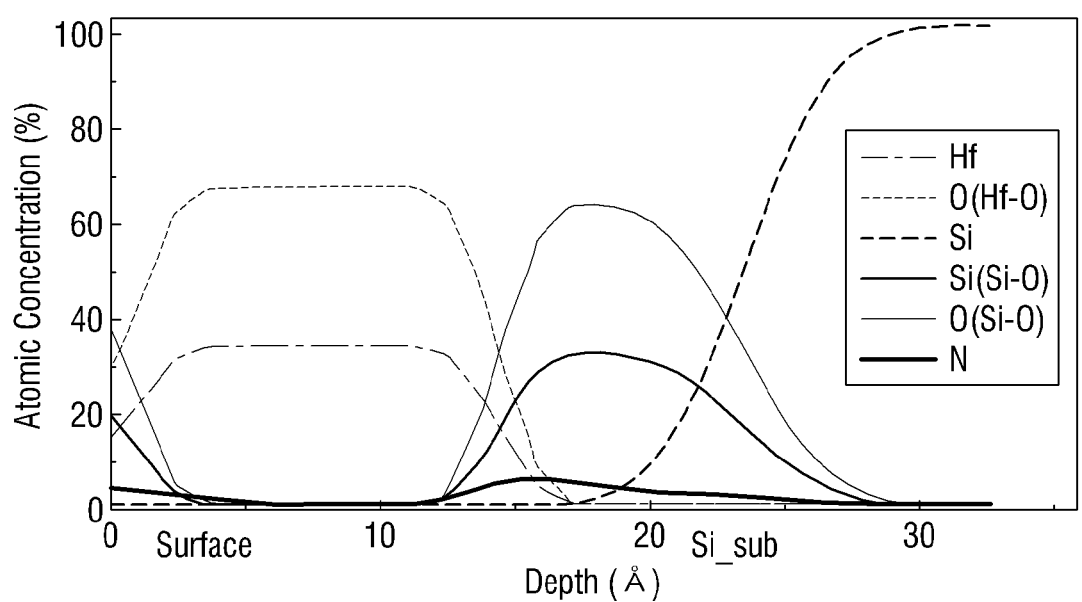
FIG. 8 is a graph of a depth-wise profile of the concentration of elements in gate insulation of a transistor of an example for comparison with a transistor fabricated according to the inventive concept.
Figure 9:
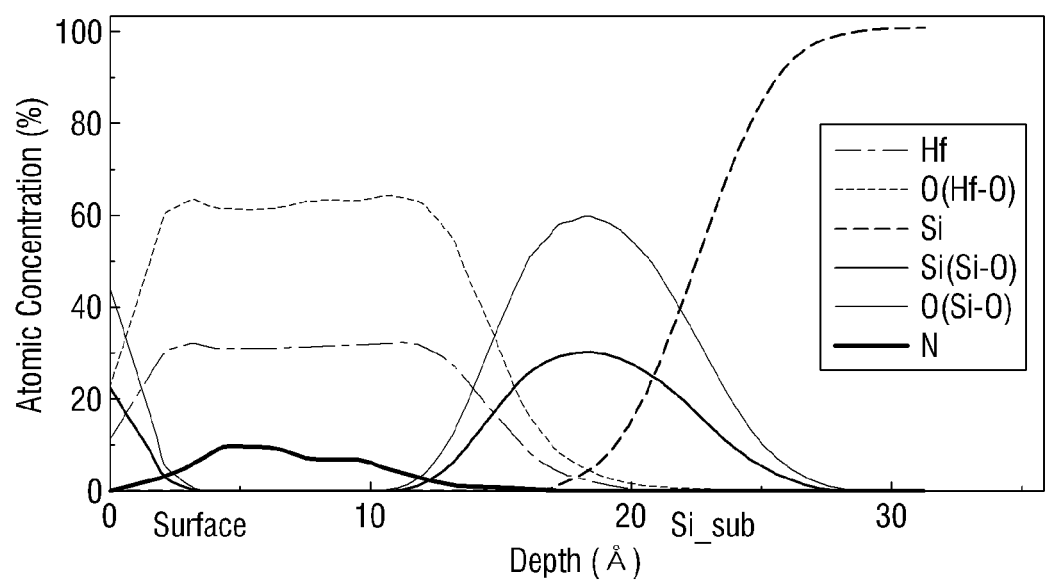
FIG. 9 is a graph of a depth-wise profile of the concentration of elements in gate insulation of a transistor fabricated according to the inventive concept.

FIGS. 8 and 9 are diagrams illustrating an effect of the method for fabricating a semiconductor device according to the inventive concept.

FIG. 8 illustrates the concentration profile of a gate insulating layer of a hypothetical semiconductor device fabricated by a method similar to that of the embodiment of FIGS. 1-7. Thus, reference numerals corresponding to those in FIG. 7 are used for descriptive purposes in that the results shown in the graph of FIG. 8 are not results drawn from the device of FIG. 7 made according to the inventive concept.

Referring to FIG. 8, it can be seen that the concentrations of hafnium (Hf) and oxygen ions (O) in the hafnium oxide layer (HfO) are high adjacent to the surface of the gate insulating layer 61, and the concentrations of silicon (Si) and the oxygen ions (O) in the silicon oxide layer ($SiO_2$) are high adjacent to an interface between a substrate Si_sub and the gate insulating layer 61.

Moreover, it can be seen that the peak of the concentration profile of the nitrogen ions (N) introduced into the gate insulating layer 61 through the nitridation process is positioned adjacent to the interface between the substrate Si_sub and the gate insulating layer.

In this case, there is a high possibility that the nitrogen ions (N) will move to the interface layer 55 disposed below the gate insulating layer 61, whereupon N—O bonding would take place.

In addition, due to the relatively low bond energy of the N—O bonds, there is a high possibility that the N—O bonds will be replaced by Hf—N or Si—N bonds by heat in a subsequent process.

In this case, i.e., if the nitrogen ions (N) in the gate insulating layer 61 become part of Hf—N or Si—N bonds, the nitrogen ions do not serve to prevent the aluminum (Al) in the metal gate electrode 78 or the work function control layer 76 from being bound with the oxygen ions (O) in the gate insulating layer 61.

FIG. 9 illustrates the concentration profile of the gate insulating layer 61 of the semiconductor device of FIG. 7 fabricated by a method according to the embodiment of the inventive concept.

Referring to FIG. 9, it can be seen that the concentration profiles of hafnium (Hf), oxygen ($O_2$) and silicon (Si) in the gate insulating layer 61 are similar to those illustrated in FIG. 8, but the peak of the concentration profile of the nitrogen ions (N) introduced into the gate insulating layer 61 of FIG. 7 through the nitridation process of FIG. 5 is located adjacent to the (upper) surface of the gate insulating layer 61 of FIG. 7 remote from the substrate.

In the above-described embodiments of a method of fabricating a semiconductor device according to the inventive concept, the pressure is maintained at 100 to 500 millitorr when the nitridation process is performed to provide the gate insulating layer 61 with the nitrogen ions (N) having a concentration profile as illustrated in FIG. 9.

More specifically, the pressure is at least 100 mm ton to limit the depth of penetration of the nitrogen ions (N) into the gate insulating layer 61 of FIG. 7 in the nitridation process. On the other hand, the pressure is at most 500 millitorr to ensure that the nitrogen ions (N) penetrate the gate insulating layer 61 of FIG. 7 in the nitridation process.

When the gate insulating layer 61 of FIG. 7 is formed as described above, there is almost no possibility that the N—O bonding will occur because the nitrogen ions (N) do not penetrate to locations adjacent the interface layer 55 below the gate insulating layer 61. As a result, a high number of nitrogen ions (N) may serve to prevent the aluminum (Al) of the metal gate electrode 78 or the work function control layer 76 from being bound with the oxygen ions (O) of the gate insulating layer 61.

More specifically, the aluminum (Al) of the metal gate electrode 78 or the work function control layer 76 tends to diffuse to the gate insulating layer 61 during the process of fabricating the semiconductor device, in which case it binds with the oxygen in the gate insulating layer 61. This, in turn, would produce an oxygen deficiency in the gate insulating layer 61 which, if left unchecked, would result in a gate insulating layer 61 of FIG. 7 having inferior insulation characteristics.

On the other hand, according to the inventive concept, when the gate insulating layer 61 becomes oxygen deficient, the nitrogen ions (N) in the gate insulating layer 61 can serve to fill the regions vacated by the oxygen to maintain the insulation characteristics of the gate insulating layer 61. That is, in the method for fabricating the semiconductor device according to the inventive concept, the gate insulating layer 61 exhibits superior insulation characteristics because a high concentration of nitrogen ions (N) is maintained in the gate insulating layer 61.

Moreover, a lattice structure of the silicon oxide ($SiO_2$) in the gate insulating layer 61 is stable. Therefore, the silicon oxide layer ($SiO_2$) may serve to prevent the oxygen ions (O) from being taken up by the aluminum (Al) in the metal gate electrode 78 or the work function control layer 76. Therefore, the gate insulating layer 61 may have excellent insulation characteristics. That is, a semiconductor device fabricated by a method according to the inventive concept has a high degree of reliability.

Figure 10:
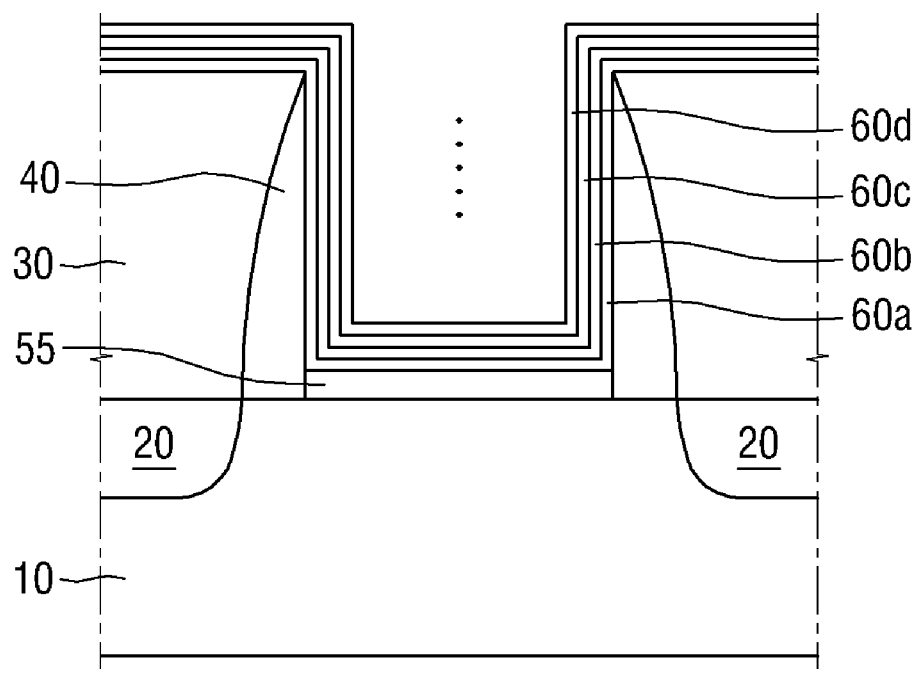
FIG. 10 is a cross-sectional view of a semiconductor device during the course of its manufacture and illustrates an embodiment of a method of fabricating such a device according to the inventive concept.

Another embodiment of a method of fabricating a semiconductor device according to the inventive concept will be described with reference to FIG. 10.

First, the processes described with reference to FIGS. 1-3 are performed.

In this embodiment of the inventive concept, after the first and second gate insulating layers 60a and 60b are formed on the interface layer 55, a third gate insulating layer 60c may be formed on the second gate insulating layer 60b and a fourth gate insulating layer 60d may be formed on the third gate insulating layer 60c.

The third gate insulating layer 60c may include substantially the same material as the first gate insulating layer 60a, and the fourth gate insulating layer 60d may include substantially the same material as the second gate insulating layer 60b, but the inventive concept is not limited thereto.

The first gate insulating layers 60a, the second gate insulating layer 60b, the third gate insulating layer 60c, and the fourth gate insulating layer 60d may be formed by atomic layer deposition (ALD), for example, More specifically, the first gate insulating layer 60a may be formed by performing the atomic layer deposition process for n (n is a natural number) cycles, and the second gate insulating layer 60b may be formed by performing the atomic layer deposition process for m (m is a natural number of m<n) cycles. The third gate insulating layer 60c may be formed by performing the atomic layer deposition process for m cycles, and the fourth gate insulating layer 60d may be formed by performing the atomic layer deposition process for m cycles.

For example, the first gate insulating layer 60a may be formed by performing the atomic layer deposition process for 18 cycles, the second gate insulating layer 60b may be formed by performing the atomic layer deposition process for 1 cycle, the third gate insulating layer 60c may be formed by performing the atomic deposition process for 1 cycle, and the fourth gate insulating layer 60d may be formed by performing the atomic layer deposition process for 1 cycle.

However, the forming of the first insulating layer 60a, the second gate insulating layer 60b, the third gate insulating layer 60c, and the fourth gate insulating layer 60d is not limited to these examples.

For instance, the gate insulating layer may be formed by repeating the above-described process. That is, the process of forming the hafnium oxide layer (HfO) and the process of forming the silicon oxide layer ($SiO_2$) of the gate insulating layer may be carried out p times (p is a natural number of 3 or more).

As the processes are repeated, the weight (wt %) of the silicon oxide ($SiO_2$) increases in the gate insulating layer and the lattice structure thereof thus becomes more stabile. Accordingly, repeating the processes may prevent with a higher degree of certainty the gate insulating layer from incurring an oxygen deficiency due to the aluminum (Al) of the metal gate electrode 78 of FIG. 7 or the work function control layer 76 of FIG. 7.

Next, yet another embodiment of a method of fabricating a semiconductor device according to the inventive concept will be described with reference to FIGS. 11 to 18.

Figure 11:
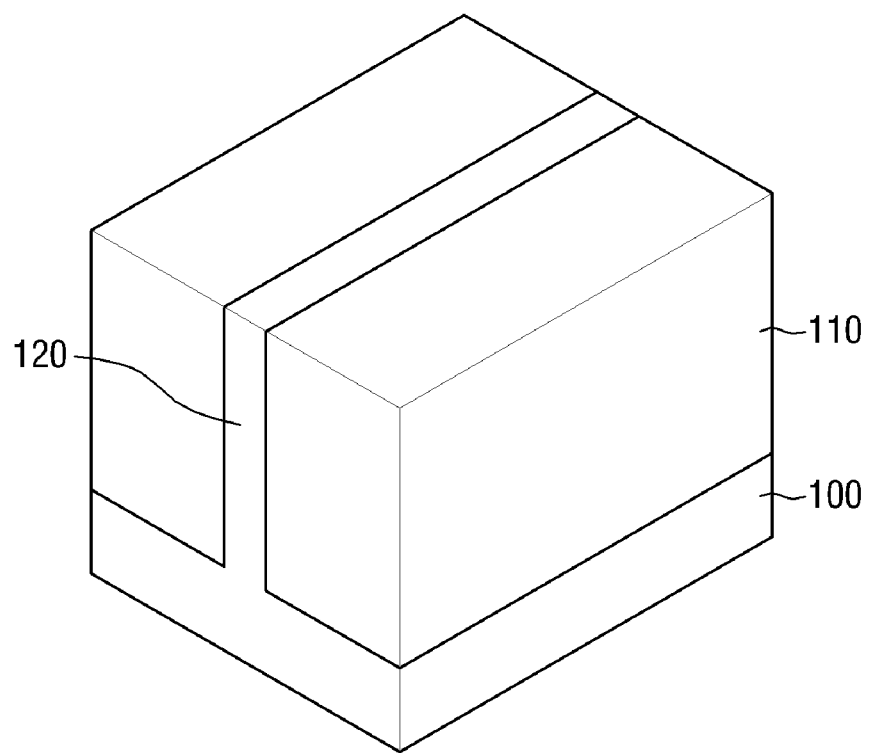
FIGS. 11, 12, 13, 14, 15, 16, 17 and 18 are each a perspective view of a semiconductor device during the course of its manufacture and together illustrate an embodiment of a method of fabricating such a device according to the inventive concept.

Referring to FIG. 11, an active fin 120 is formed on the substrate 100.

The active fin 120 may be formed by forming a dummy spacer on the substrate 100 and etching the substrate 100 using the dummy spacer through a mandrel process, for example, but the inventive concept is not limited thereto.

The substrate 100 may be a bulk silicon or silicon-on-insulator substrate. Alternatively, the substrate 100 may comprise silicon germanium, antimony indium, a lead tellurium compound, indium arsenic, indium phosphide, gallium arsenide, or antimony gallium.

In examples of this embodiment, the substrate 100 comprises an epitaxial layer formed on a base, and the active fin 120 is formed from the epitaxial layer. The epitaxial layer may be a layer of silicon or germanium. Alternatively, the epitaxial layer may comprise a compound semiconductor, for example, a group IV-IV compound semiconductor or a group III-V compound semiconductor. Examples of the group IV-IV compound semiconductor include both binary and ternary compounds including at least two of carbon (C), silicon (Si), germanium (Ge), and tin (Sn), or a compound comprising at least one of carbon (C), silicon (Si), germanium (Ge), and tin (Sn) doped with another group IV element. Examples of the group III-V compound semiconductor include binary, a ternary, or quaternary compounds comprising at least one of aluminum (Al), gallium (Ga), and indium (In) as the group III element and one of phosphorus (P), arsenic (As), and antimony (Sb) as the group V element.

In the example that follows, the substrate 100 is a silicon substrate.

The active fin 120 extends in a second direction Y. Part of the substrate 100 may be removed to form recesses therein that define the active fin.

FIG. 11 illustrates the active fin 120 as having vertical side surfaces, but the inventive concept is not limited thereto. That is, the side surfaces of the active fin 120 may have a slope, i.e., the active fin 120 may be tapered.

Subsequently, a field insulating layer 110 is formed in the vicinity of the active fin 120 to fill the recesses in the substrate 100. The field insulating layer 110 may be made of at least material selected from the group consisting of a silicon oxide, silicon nitride layer, and silicon oxynitride.

Subsequently, the field insulating layer 110 is planarized. Upper surfaces of the active fin 120 and the field insulating layer 110 may be made coplanar through the planarization process.

Figure 12:
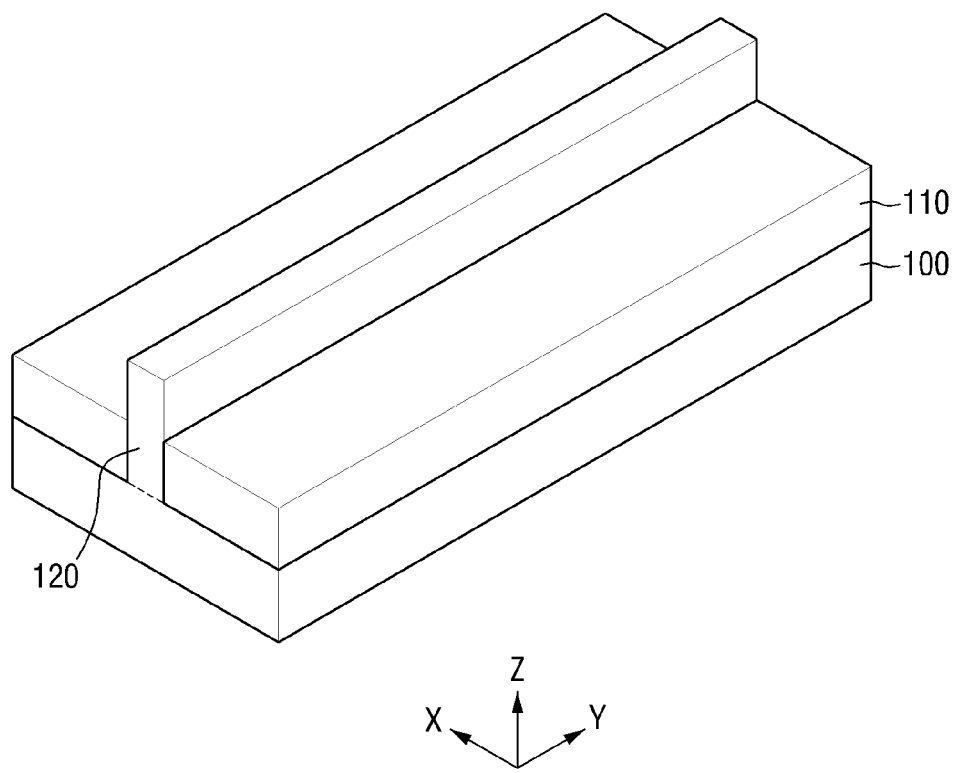

Referring to FIG. 12, next, the field insulating layer 110 is recessed to expose side surfaces of the active fin 120. That is, as a result, the active fin 120 protrudes above the field insulating layer 110. The recess process may include a selective etching process.

Alternatively, the part of the active fin 120 that protrudes above the field insulating layer 110 may be formed by an epitaxial process. More specifically, after the field insulating layer 110 is formed, a part of the active fin 120 may be formed by an using the active fin 120 exposed by the field insulating layer 110 as a seed in an epitaxial growth process.

In some embodiments of the inventive concept, the active fin 120 is doped with an impurity for controlling a threshold voltage. When the active fin 120 is to constitute an NMOS transistor, the impurity is, for example, boron (B). When the active fin 120 is to constitute a PMOS transistor, the impurity is, for example, phosphorus (P) or arsenic (As).

Figure 13:
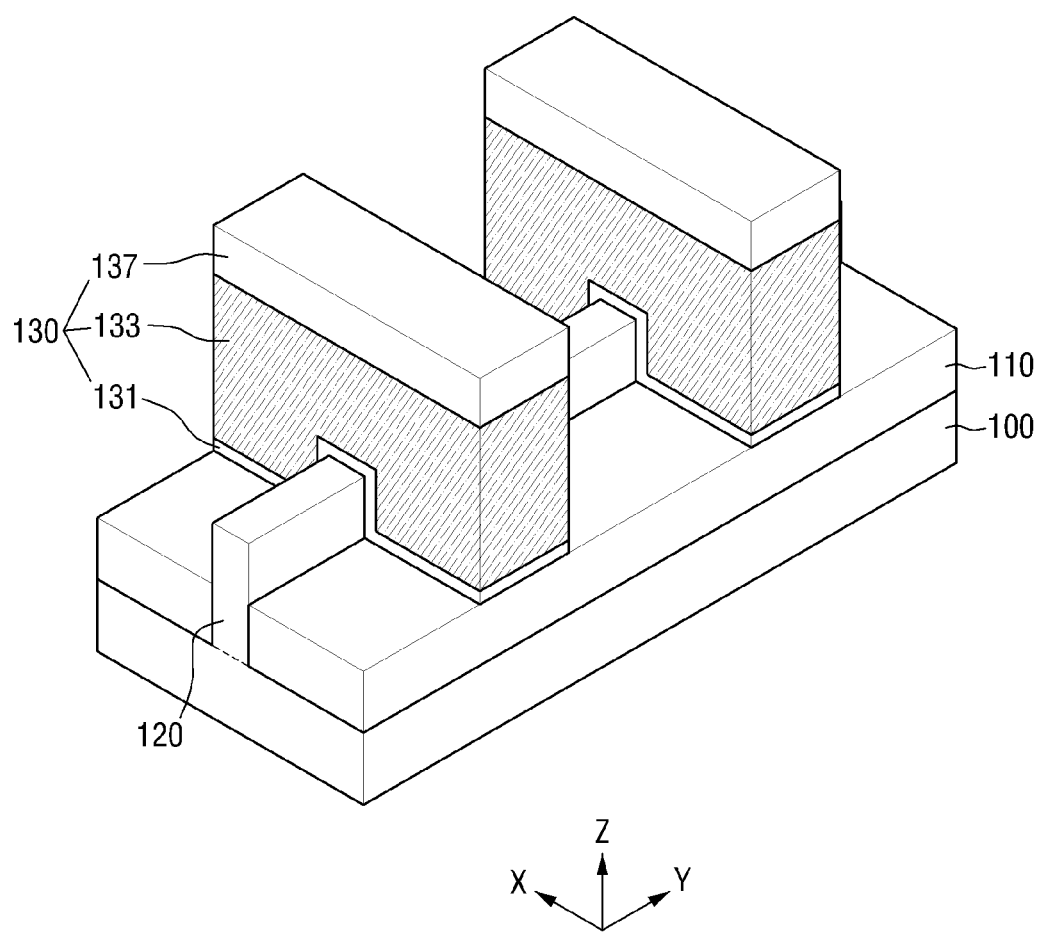

Referring to FIG. 13, next, a dummy gate structure 130 that crosses the active fin 120 is formed. The dummy gate structure 130 may extend in a first direction X.

The dummy gate structure 130 may include a dummy silicon oxide layer 131, a polysilicon layer 133, and a hard mask 137 sequentially formed so as to be a laminate. That is, the dummy gate structure 130 may be a laminate of the dummy silicon oxide layer 131, the polysilicon layer 133, and the hard mask 137 which extend in the first direction X.

The dummy gate structure 130 may be formed using the hard mask 137 as an etch mask.

In FIG. 13, the dummy silicon oxide layer 131 is illustrated as formed not only around the active fin 120 but also on the field insulating layer 110, but the inventive concept is not limited thereto. That is, the dummy silicon oxide layer 131 may be formed only on the surfaces of the active fin 120 that protrude above the field insulating layer 110.

Furthermore, the dummy silicon oxide layer 131 is shown as not being formed on the parts of the active fin 120 which do not overlap the dummy gate structure 130, but the inventive concept is not limited thereto. That is, the dummy silicon oxide layer 131 may be formed on the entirety of the surfaces of the active fin 120 that protrude above the field insulating layer 110.

The dummy silicon oxide layer 131 may serve to protect the active fin 120 during a subsequent process.

The polysilicon layer 133 may overlap the dummy gate structure 130 and cover the entirety of the part of the active fin 120 that protrudes above the field insulating layer 110. In other words, the distance from the field insulating layer 110 to the upper surface of the active fin 120 is smaller than the distance from the field insulating layer 110 to the upper surface of the polysilicon layer.

The polysilicon layer 133 and the dummy silicon oxide layer 131 may have high etch selectivity. Therefore, when the polysilicon layer 133 is removed in a subsequent trench forming process for forming a replacement metal gate, the dummy silicon oxide layer 131 disposed therebelow remains so that the active fin 120 below the dummy silicon layer 131 may be protected.

The hard mask 137 includes, for example, silicon nitride (SiN), but the inventive concept is not limited thereto. Furthermore, the hard mask 137 may comprise a material having higher resistance to etching than a gate spacer layer 151p described with reference to FIG. 14.

Figure 14:
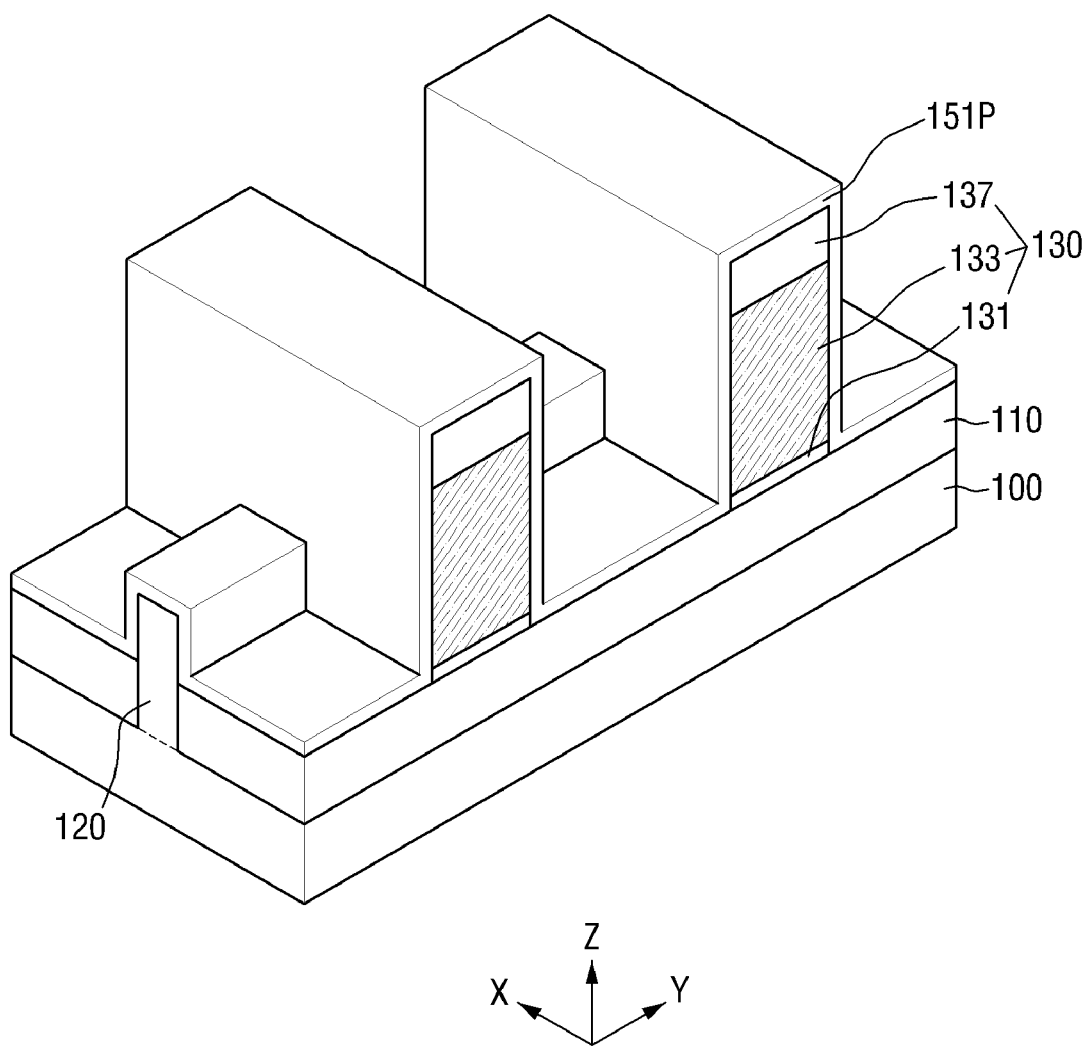

Referring to FIG. 14, gate spacer layer 151p is formed over the active fin 120 and the dummy gate structure 130. The gate spacer layer 151p may be conformally formed. i.e. may conform to the topography of the structure of the dummy gate structure 130, the active fin 120, and the field insulating layer 110. The gate spacer layer 151p may include a low dielectric constant material, for example, SiOCN, but the inventive concept is not limited thereto. The gate spacer layer 151p may be formed using, for example, chemical vapor deposition (CVD), atomic layer deposition (ALD), or the like.

In an example of this embodiment of a method of fabricating a semiconductor device according to the inventive concept, the hard mask 137 is a layer of silicon nitride (SiN), and the gate spacer layer 151p is a layer of SiOCN. In this case, in an etching process in which the hard mask 137 and the gate spacer layer 151p are simultaneously etched, the hard mask 137 has higher resistance to the etchant than the gate spacer layer 151p. Accordingly, as illustrated in FIG. 15, although the hard mask 137 and the gate spacer layer 151p are simultaneously subjected to the etching process, the gate spacer 151 is formed from the spacer layer 151p on the sides of the dummy gate structure 130, and the hard mask 137 essentially remains as exposed at the top of the dummy gate structure 130.

Figure 15:
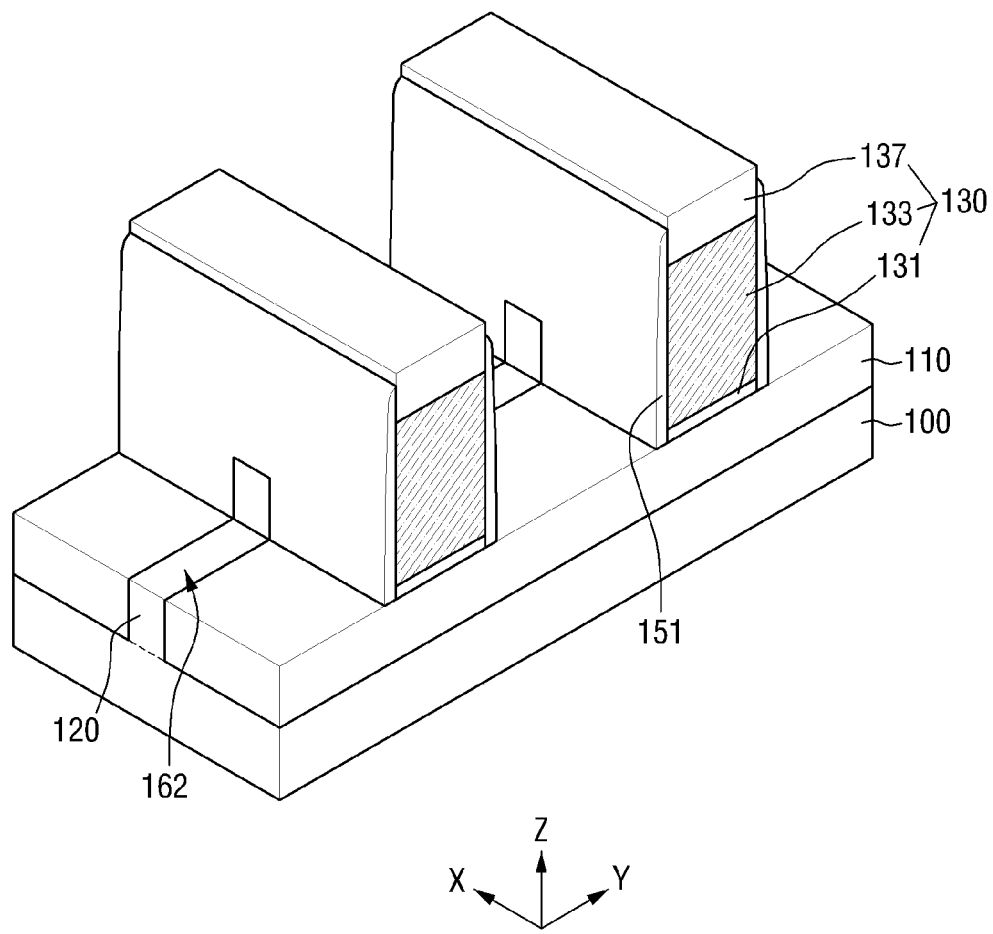

Still referring to FIG. 15, a trench 162 may be formed at the sides of the dummy gate structure 130. More specifically, the trench 162 may be formed in the active fin 120 at the sides of the gate spacer 151.

The gate spacer 151 and the trench 162 in the active fin 120 may be simultaneously formed. That is, when the trench 162 is formed, the gate spacer 151 may also be formed.

Considering that the gate spacer 151 is formed by etching the gate spacer layer 151p of FIG. 14, the gate spacer 151 is preferably of material different from that of the hard mask 137. Furthermore, the hard mask 137 may be formed of material having higher resistance to etching than that of the gate spacer 151.

As shown in FIG. 15, the distance from the field insulating layer 110 to the top of the gate spacer 151 may be smaller than the distance from the field insulating layer 110 to the top of the dummy gate structure 130, that is, the upper surface of the hard mask 137.

When the gate spacer 151 is formed on the sides of the dummy gate structure 130, a fin spacer may be formed even on the sides of the active fin 120 that do not overlap the dummy gate structure 130. However, the fin spacer formed on the sides of the active fin 120 needs to be removed in order to form the trench 162 in the active fin 120. While the fin spacer formed on the side of the active fin 120 is removed, the height of the gate spacer 151 may also be decreased and a part of the hard mask 137 may also be removed.

In this case, because the hard mask 137 includes material having higher resistance to etching than the gate spacer 151, the thickness of the hard disk 137 removed is smaller than the vertical amount of the gate spacer 151 which is removed. Therefore, the height of the gate spacer 151, as taken from the upper surface of the field insulating layer 110, becomes smaller than that of the dummy gate structure 130.

Figure 16:
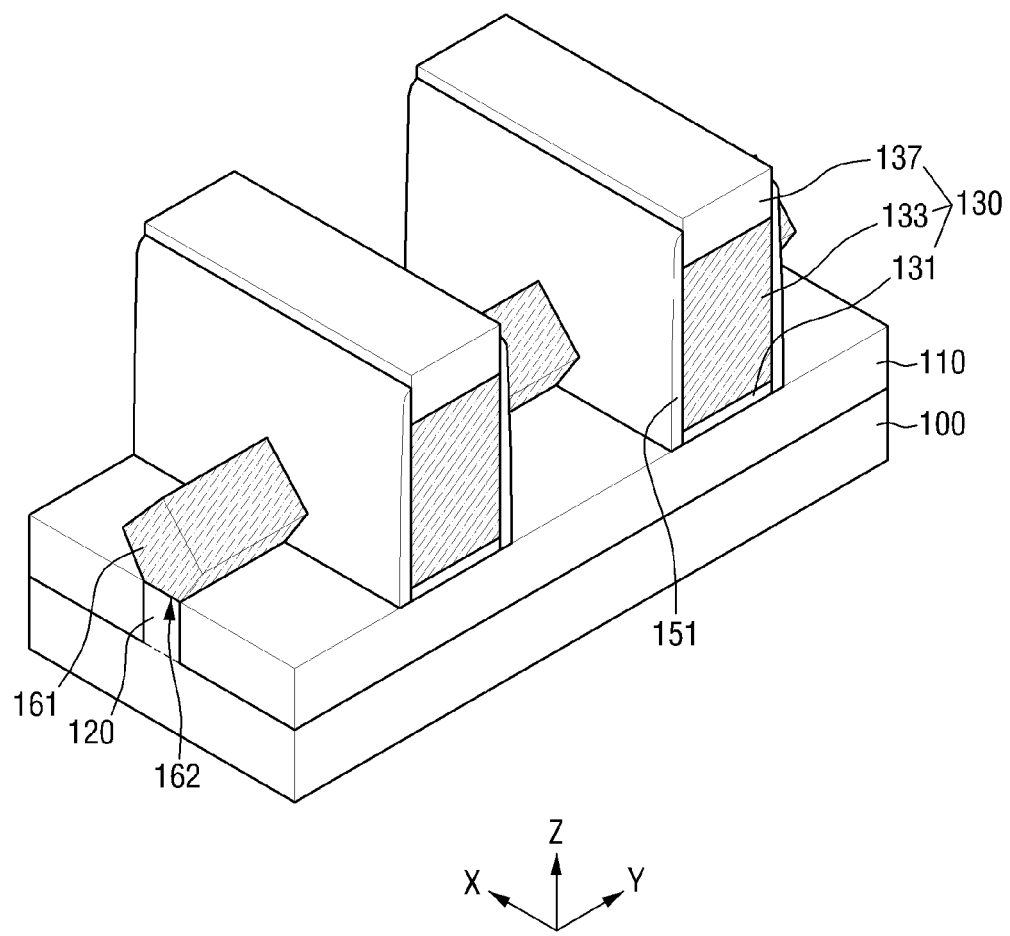

Referring to FIG. 16, a semiconductor pattern 161 is formed in the trench 162 by epitaxial growth. The semiconductor pattern 161 is formed on the sides of the dummy gate structure 130. The semiconductor pattern 161 serves as a source/drain of the transistor, i.e., the semiconductor pattern 161 constitutes an elevated source/drain.

When the transistor is a PMOS transistor, the semiconductor pattern 161 may comprise a compressive stress material. In this example, the compressive stress material is a material, for example, SiGe, having a larger lattice constant than Si. The compressive stress material applies compressive stress to the active fin 120 to improve the mobility of the carrier in the channel region.

On the other hand, when the transistor is an NMOS transistor, the semiconductor pattern 161 may include the same material as the substrate 100 or a tensile stress material. Again, in this example in which the substrate consists of Si, the semiconductor pattern 161 may be formed of Si or a material (for example, SiC) having a smaller lattice constant than Si.

When the semiconductor pattern 161 is formed, impurities may be doped in the semiconductor pattern 161 in-situ during the epitaxial process if necessary.

The semiconductor pattern 161 may have a generally diamond-shaped, pentagonal, hexagonal, circular, or rectangular cross section. In FIG. 16, for example, the generally diamond-shaped cross section is illustrated, but the inventive concept is not limited thereto. Note, here, the cross section is deemed to be generally diamond-shaped when the width of the bottom (in the X direction in the figures) of the semiconductor pattern 161 is substantially less than the length of any of the sides of the semiconductor pattern 161.

Figure 17:
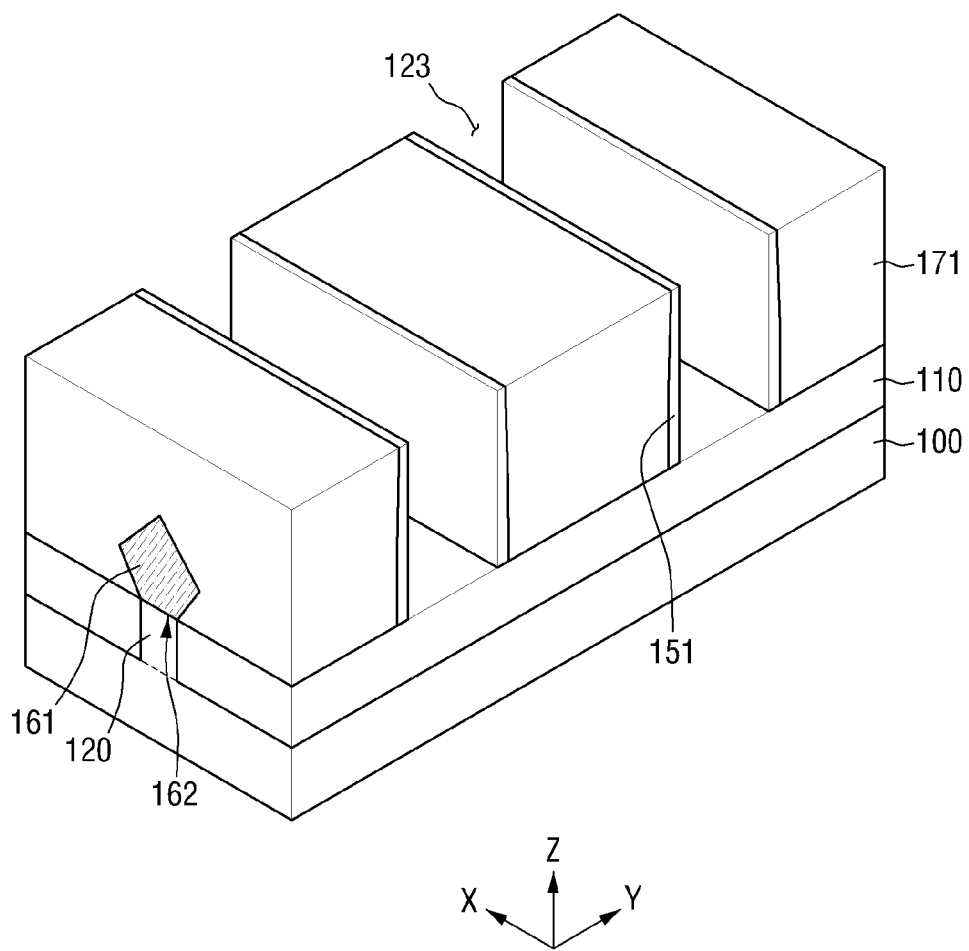

Referring to FIG. 17, an interlayer insulating layer 171 that covers the semiconductor pattern 161 and the dummy gate structure 130 is formed on the field insulating layer 110.

The interlayer insulating layer 171 includes, for example, at least one of a low dielectric constant material, an oxide layer, a nitride layer, and an oxynitride layer. Examples of the low dielectric constant material include flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP), plasma enhanced oxide (PEOX), flowable CVD (FCVD) oxide, and combinations thereof, but the inventive concept is not limited thereto.

Subsequently, the interlayer insulating layer 171 is planarized until the hard mask 137 is exposed. Alternatively, the interlayer insulating layer 171 is planarized until the polysilicon layer 133 is exposed. In this case, the hard mask 137 is removed.

In any case, the polysilicon layer 133 and the dummy silicon oxide layer 131 are removed to form trench 123 on the active fin 120. That is, the trench 123 is formed on the active fin 120 by removing the dummy gate structure 130.

Figure 18:
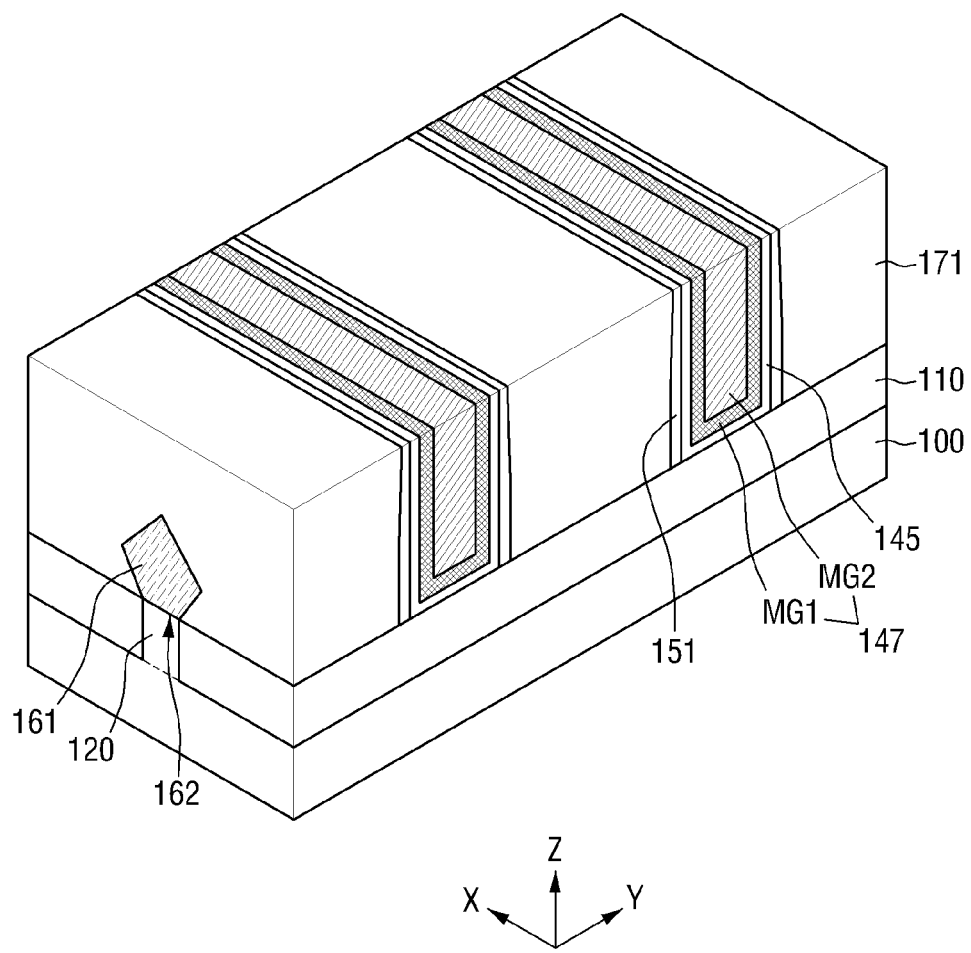

Referring to FIG. 18, a gate insulating layer 145 and a replacement gate electrode 147 are formed in the trench 123. Although not illustrated in FIG. 18, the interface layer 55 may be formed as described with reference to FIGS. 2-7 on the active fin 120 so as to be disposed below the gate insulating layer 145.

Such an interface layer 55 and the gate insulating layer 145 may be formed according to any of the embodiments of the inventive concept, and examples thereof, described above.

The gate insulating layer 145 may be formed to extend in a third direction Z along the sides of the spacer 151 and the gate electrode 147 as illustrated in FIG. 18.

The gate electrode 147 may include metal layers MG1 and MG2 as illustrated in FIG. 18. The first metal layer MG1 may serve to control a work function, and the second metal layer MG2 serves to fill a space formed by the first metal layer MG1. For example, the first metal layer MG1 may comprise at least one of TiN, TaN, TiC, and TaC. The second metal layer MG2 may comprise W or Al.

Although not illustrated in FIG. 18, a capping layer 72 and bather layer 74 may be formed on the gate insulating layer 145 in a manner described with reference to FIGS. 6 and 7.

Next, still another embodiment of a method of fabricating a semiconductor device according to the inventive concept will be described with reference to FIGS. 19 and 20.

Figure 19:
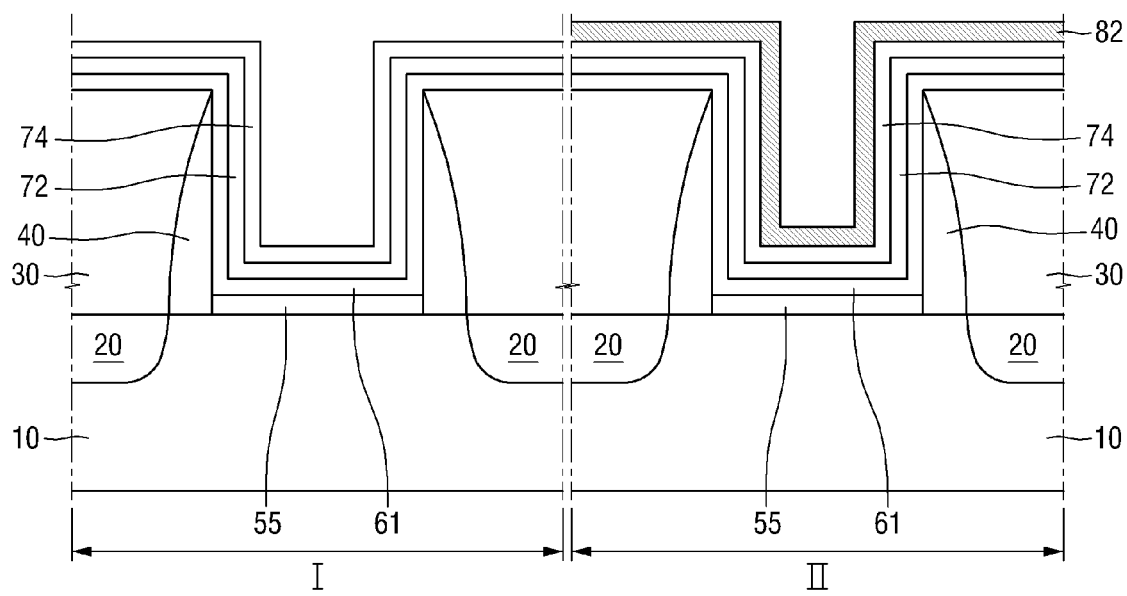
FIGS. 19 and 20 are each a cross-sectional view of a semiconductor device during the course of its manufacture and together illustrate an embodiment of a method of fabricating such a device according to the inventive concept

First, referring to FIG. 19, a semiconductor device manufactured by this method according to the inventive concept includes a first area I and a second area II. The first area I is an NMOS area, and the second area II is a PMOS area in this example.

The process described above with reference to FIGS. 1 to 5 is performed in the first and second areas I and II. Next, a capping layer 72 and a barrier layer 74 are sequentially formed in the first and second areas I and II.

Thereafter, a p-type work function control layer 82 is formed in the first and second areas I and II. An example of the p-type work function control layer 82 is a TiN layer, but the inventive concept is not limited thereto.

Next, after a mask is formed on the substrate 10 in the second area II, the p-type work function control layer 82 is removed from the first area I. That is, the p-type work function control layer 82 is removed from the NMOS area.

Figure 20:
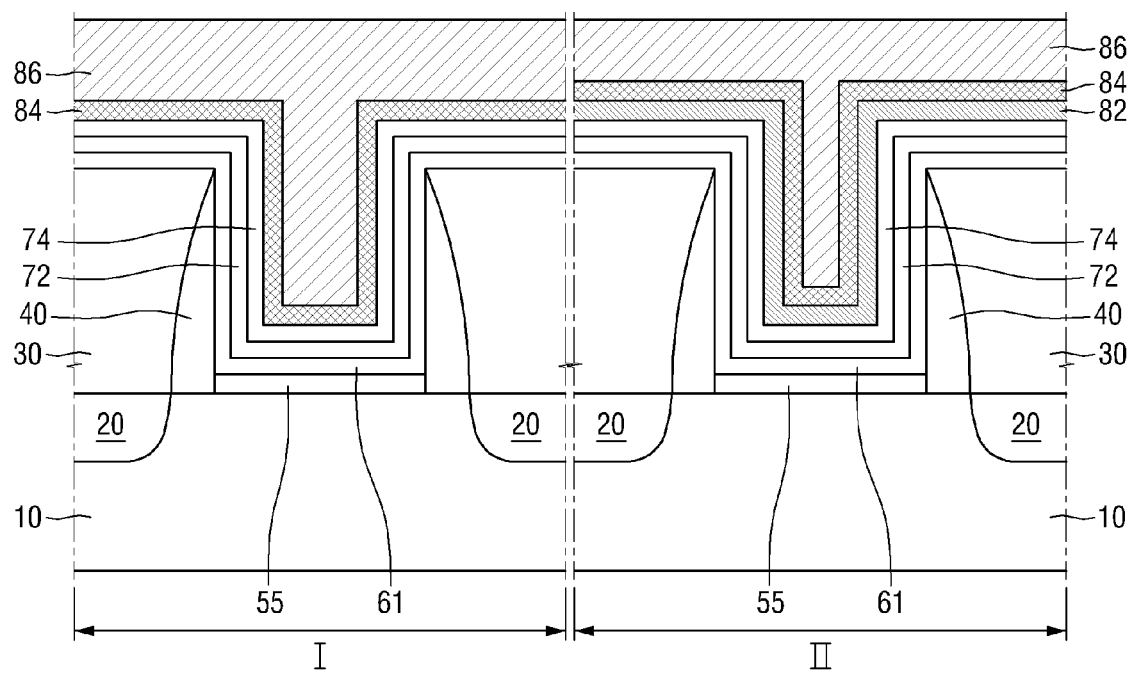

Referring to FIG. 20, an n-type work function control layer 84 is formed on the substrate 10 in the first and second areas I and II. Examples of the n-type work function control layer 84 include a layer of TiAl, TiAlN, TaC, TaAlN, TiC, or HfSi, but the inventive concept is not limited thereto.

Next, a metal gate electrode 86 is formed on the substrate 10 in the first and second areas I and II. The metal gate electrode 86 may fill a trench formed by the n-type work function control layer 84.

Figure 21:
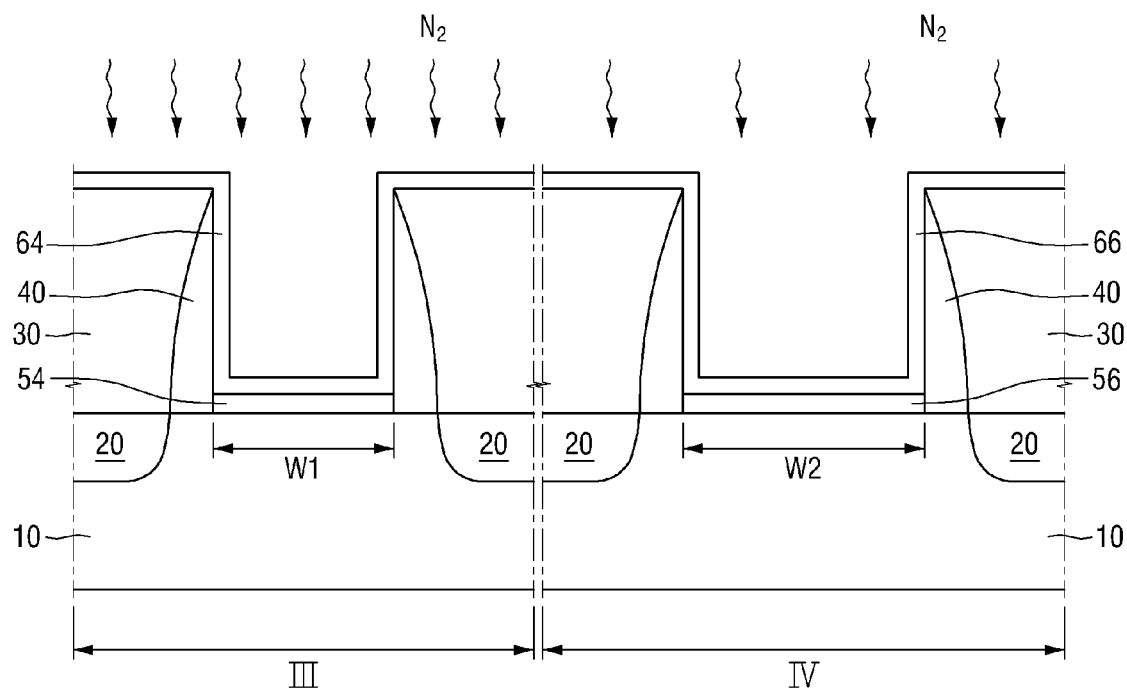
FIG. 21 is a cross-sectional view of a semiconductor device and illustrates an embodiment of a method of fabricating such a device according to the inventive concept.

FIG. 21 illustrates yet another embodiment a method of fabricating a semiconductor device according to the inventive concept.

The semiconductor device manufactured by this embodiment according to the inventive concept includes discrete areas which will be referred to arbitrarily as a third area III and a fourth area IV simply to discriminate them from one another.

The process described above with reference to FIGS. 1 to 4 is performed in the third and fourth areas III and IV.

In this case, a first interface layer 54 formed in the third area III has a width W1, and a second interface layer 56 formed in the fourth area IV has a width W2 greater than the width W1. That is, the channel length of a semiconductor element (i.e., the transistor) formed in the third area III is smaller than the channel length of a semiconductor element (i.e., the transistor) formed in the fourth area IV.

Accordingly, the width W1 of the gate insulating layer 64 doped with silicon (Si) formed in the third area III on the first interface layer 54 within the interlayer insulating layer 30, is smaller than the width W2 of the gate insulating layer 66 doped with silicon (Si) formed in the fourth area IV on the second interface layer 56 within the interlayer insulating layer 30.

Next, a first nitridation process is performed on the gate insulating layer 64 in the third area III, and a second nitridation process is performed on the gate insulating layer 66 in the fourth area IV.

The first nitridation process may be performed on the gate insulating layer so that the gate insulating layer 64 has a first nitrogen concentration, and the second nitridation process may be performed on the gate insulating layer 66 in such a way that the gate insulating layer 66 has a nitrogen concentration smaller than the first nitrogen concentration.

Then various ones of the processes described with reference to FIGS. 6 through 20 may be performed to form capping, barrier, and work function control layers, and metal gate electrodes comprising Al on the gate insulating layers 64, 66.

In this embodiment of a method of fabricating a semiconductor device according to the inventive concept, nitridation processes are performed so that even though the semiconductor device includes transistors having different channel lengths, the gate dielectrics of the transistors can be provided with nitrogen concentrations tailored to their lengths to ensure optimal reliability.

Figure 22:
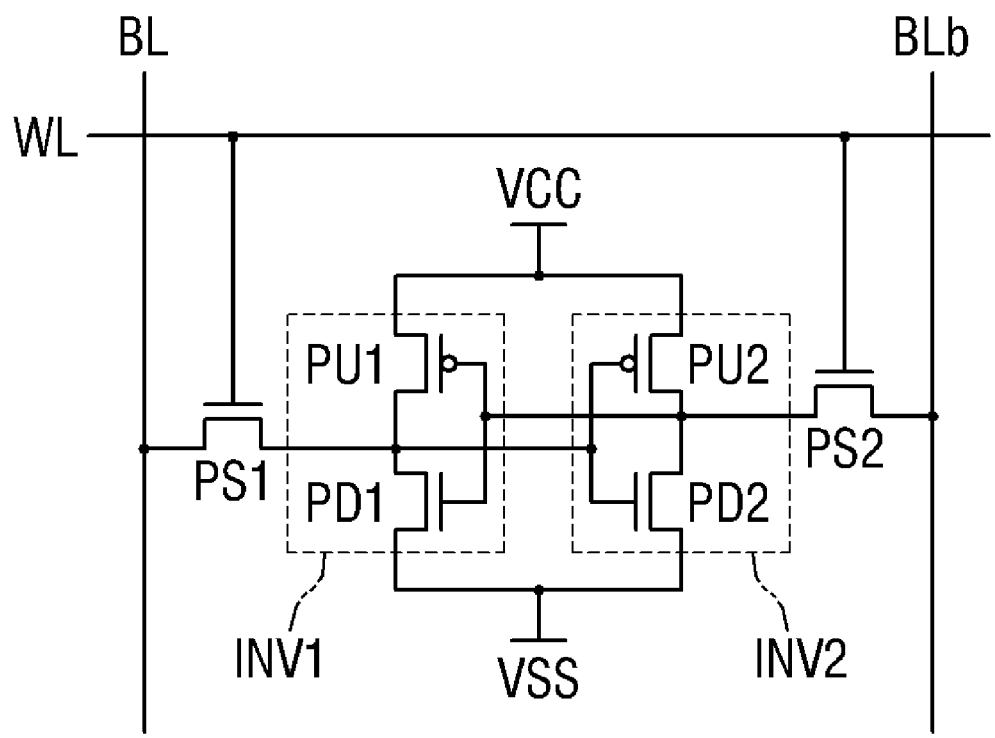
FIG. 22 is a circuit diagram of a memory device fabricated by a method according to the inventive concept.
Figure 23:
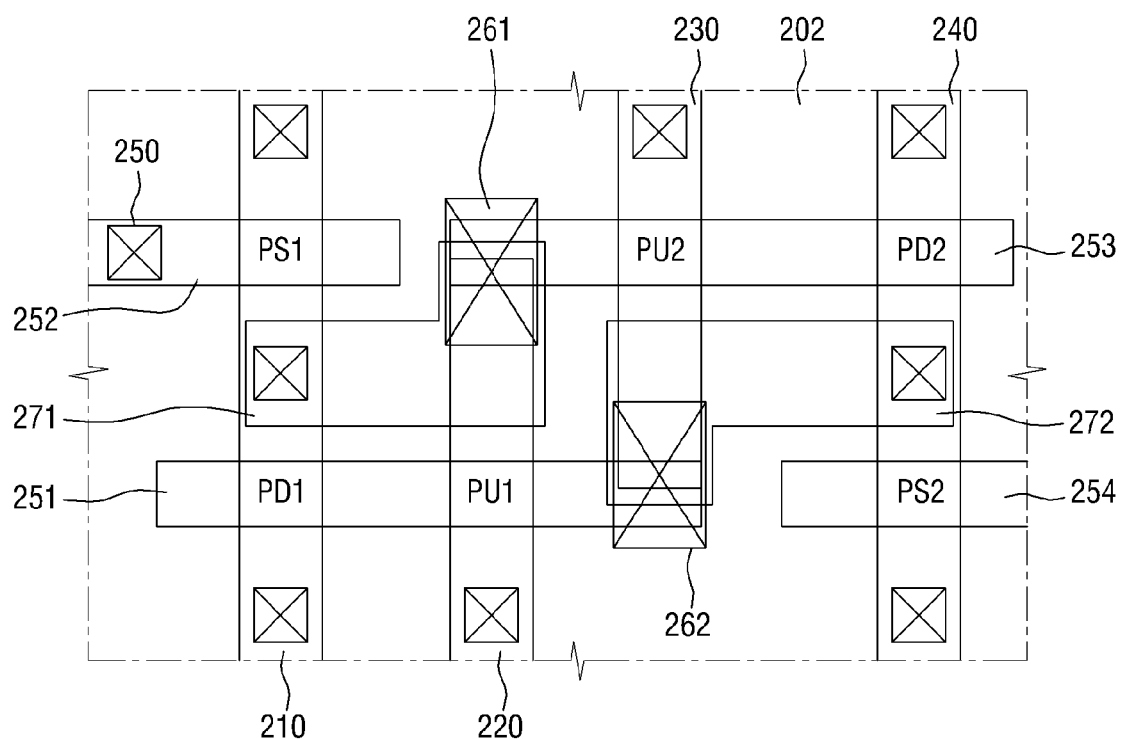
FIG. 23 is a diagram of a layout of the memory device providing the circuit illustrated in FIG. 22.

FIG. 22 is a circuit diagram of a memory device by using a method according to the inventive concept. FIG. 23 illustrate a layout of the memory device.

Referring to FIGS. 22 and 23, the memory device may include a pair of inverters INV1 and INV2 connected between a power node VCC and a ground node VSS in parallel, and a first pass transistor PS1 and a second pass transistor PS2 connected to output nodes of the inverters INV1 and INV2, respectively.

The first pass transistor PS1 and the second pass transistor PS2 may be connected to a bit line BL and a complementary bit line BLb, respectively. Gates of the first pass transistor PS1 and the second pass transistor PS2 may be connected to a word line WL.

The first inverter INV1 includes a first pull-up transistor PU1 and a first pull-down transistor PD1 which are connected to each other in series, and the second inverter INV2 may include a second pull-up transistor PU2 and a second pull-down transistor PD2 which are connected to each other in series.

The first pull-up transistor PU1 and the second pull-up transistor PU2 may be PFET transistors, and the first pull-down transistor PD1 and the second pull-down transistor PD2 may be NFET transistors.

Furthermore, an input node of the first inverter INV1 may be connected to an output node of the second inverter INV2, and an input node of the second inverter INV2 may be connected to an output node of the first inverter INV1 such that the first inverter INV1 and the second inverter INV2 constitute a single latch circuit.

Still referring to FIGS. 22 and 23, a first active fin 210, a second active fin 220, a third active fin 230, and a fourth active fin 240 are elongated (extend longitudinally) in a first direction and spaced apart from each other in another direction perpendicular to the first direction. Lengths of the second active fin 220 and the third active fin 230 may be smaller than lengths of the first active fin 210 and the fourth active fin 240.

In addition, a first gate electrode 251, a second gate electrode 252, a third gate electrode 253, and a fourth electrode 254 are elongated in the second direction, and the first gate electrode 251 to the fourth gate electrode 254 each cross at least one of the first active fin 210 to the fourth active fin 240.

More specifically, the first gate electrode 251 crosses the first active fin 210 and the second active fin 220, and may overlap an end of the third active fin 230. The third gate electrode 253 crosses the fourth active fin 240 and the third active fin 230, and may overlap an end of the second active fin 220. The second gate electrode 252 and the fourth electrode 254 cross the first active fin 210 and the fourth active fin 240, respectively.

As illustrated in FIG. 23, the first pull-up transistor PU1 is disposed in the region at which the first gate electrode 251 and the second active fin 220 cross each other, the first pull-down transistor PD1 is disposed in the region at which the first gate electrode 251 and the first active fin 210 cross each other, and the first pass transistor PS1 is disposed in the region at which the second gate electrode 252 and the first active fin 210 cross each other.

The second pull-up transistor PU2 is disposed in the region at which the third gate electrode 253 and the third active fin 230 cross each other, the second pull-down transistor PD2 is disposed in the region at which the third gate electrode 253 and the fourth active fin 240 cross each other, and the second pass transistor PS2 is disposed in the region at which the fourth gate electrode 254 and the fourth active fin 240 cross each other.

Although not illustrated in FIG. 23 but as indicated in FIG. 22, sources and drains are formed at sides of each region at which a first to fourth gate electrode 251 to 254 crosses a first to fourth active fin 210, 220, 230, and 240. In addition, contacts 250 extend through an interlayer insulation layer (not shown) into contact with the sources and drains, respectively.

In addition, a first shared contact 261 may simultaneously connect the second active fin 220, the third gate electrode 253, and a wire 271. A second shared contact 262 may simultaneously connect the third active fin 230, the first gate electrode 251, and a wire 272.

At least one of the first and second pull-up transistors PU1 and PU2, the first and second pull-down transistors PD1 and PD2, and the first and second pass transistors PS1 and PS2 may be fabricated by a method described above according to the inventive concept.

Figure 24:
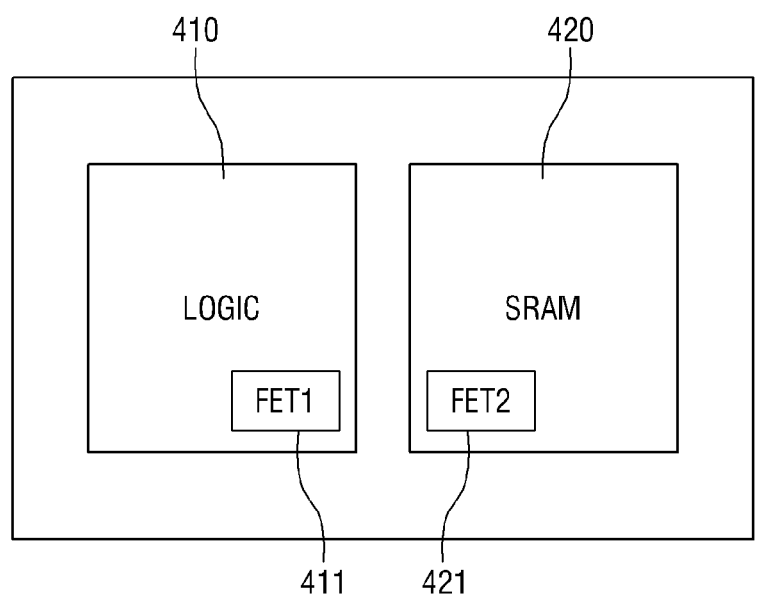
FIG. 24 is a schematic diagram of one example of a semiconductor device fabricated by a method according to the inventive concept.
Figure 25:
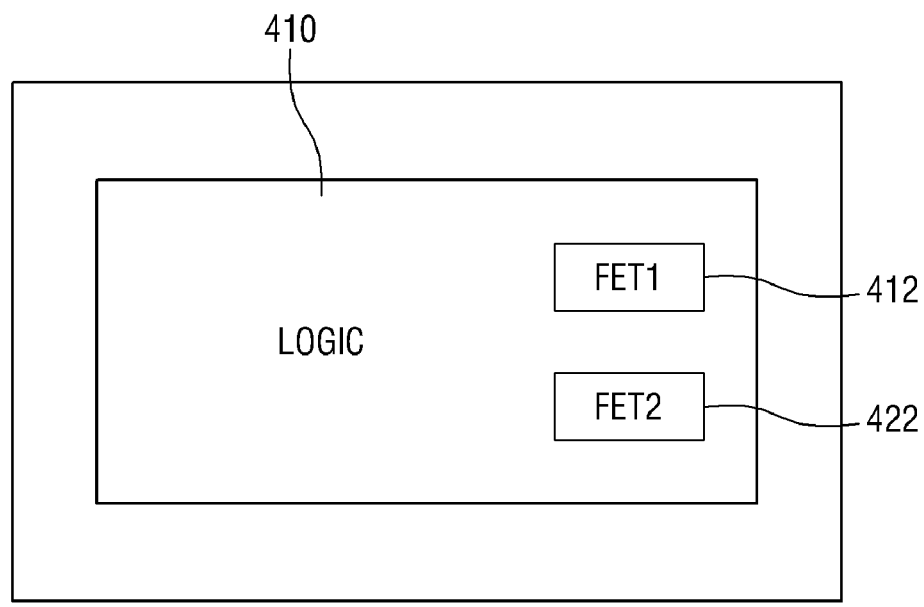
FIG. 25 is a schematic diagram of another example of a semiconductor device fabricated by a method according to the inventive concept.

FIGS. 24 and 25 illustrate examples of semiconductor devices fabricated using methods according to the inventive concept.

Referring to FIG. 24, semiconductor device 13 includes a logic area 410 and an SRAM region 420. A transistor 411 may be disposed in the logic area 410, and a transistor 421 may be disposed in the SRAM region 420.

The transistor 411 and the transistor 421 may be structured differently from each other. For example, the channel of transistor 421 may be shorter than the channel of the transistor 411. The transistors 411 and 421 may be fabricated by an embodiment of a method according to the inventive concept described above.

Referring to FIG. 25, semiconductor device 14 includes a logic region 410, in which different transistors 412 and 422 are disposed. Alternatively, the transistors 412 and 422 may both be disposed in an SRAM region.

The transistor 412 and the transistor 422 may be structured differently from each other. For example, the transistor 412 may be an NMOS transistor and the transistor 422 may be a PMOS transistor, but the inventive concept is not limited thereto. The transistors 412 and 422 are fabricated by an embodiment of a method according to the inventive concept described above.

Although FIGS. 24 and 25 illustrate examples in which transistors are fabricated in according to the inventive concept in a logic region 410 and/or SRAM regions, the inventive concept is not limited thereto. For example, the inventive concept may be applied to the fabrication of transistors in other regions (for example, DRAM, MRAM, RRAM, and PRAM regions, and the like).

Figure 26:
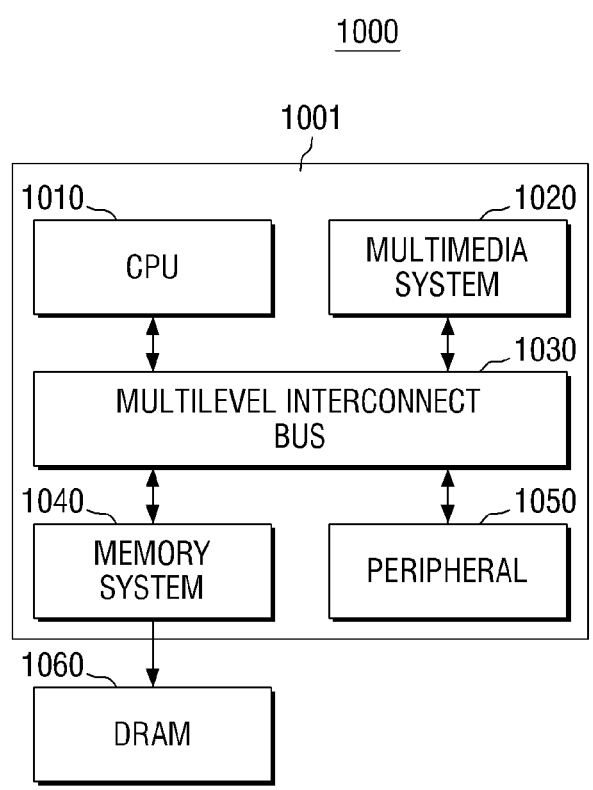
FIG. 26 is a block diagram of an SoC system including a semiconductor device fabricated by a method according to the inventive concept.

FIG. 26 is a block diagram of an SoC system including a semiconductor device fabricated by an embodiment of a method according to the inventive concept.

Referring to FIG. 26, SoC system 1000 include an application processor 1001 and a DRAM 1060.

The application processor 1001 may include a central processing unit 1010, a multimedia system 1020, a bus 1030, a memory system 1040, and a peripheral circuit 1050.

The central processing unit 1010 may perform an operation required for driving the SoC system 1000. The central processing unit 1010 may include a plurality of cores, i.e., may be a multi-core processor.

The multimedia system 1020 may perform any of various multimedia functions in the SoC system 1000. The multimedia system 1020 may include a 3D engine module, a video codec, a display system, a camera system, a post-processor, or the like.

The bus 1030 facilitates data communication between the central processing unit 1010, the multimedia system 1020, the memory system 1040, and the peripheral circuit 1050. The bus 1030 may have a multi-layered structure. More specifically, examples of the bus 1030 include a multi-layer advanced high performance bus (AHB) and a multi-layer advanced extensible interface (AXI).

The memory system 1040 mat allow the application processor 1001, connected to the external memory (the DRAM 1060 in this example), to operate at a high speed. The memory system 1040 may include a separate controller (for example, a DRAM controller) for controlling the external memory (the DRAM 1060).

The peripheral circuit 1050 may allow the SoC system 1000 to smoothly access an external device (for example, a main board). To this end, the peripheral circuit 1050 may include various interfaces so that the external device connected to the SoC system 1000 is compatible.

The DRAM 1060 may serve as an operation memory required for the application processor 1001 to operate. The DRAM 1060 may be disposed outside the application processor 1001 as illustrated in the figure. However, the DRAM 1060 may be packaged with the application processor 1001 in a package on package (PoP).

The transistor(s) of at least one of the components of the SoC system 1000, comprising a semiconductor device, is fabricated by a method according to the inventive concept.

Figure 27:
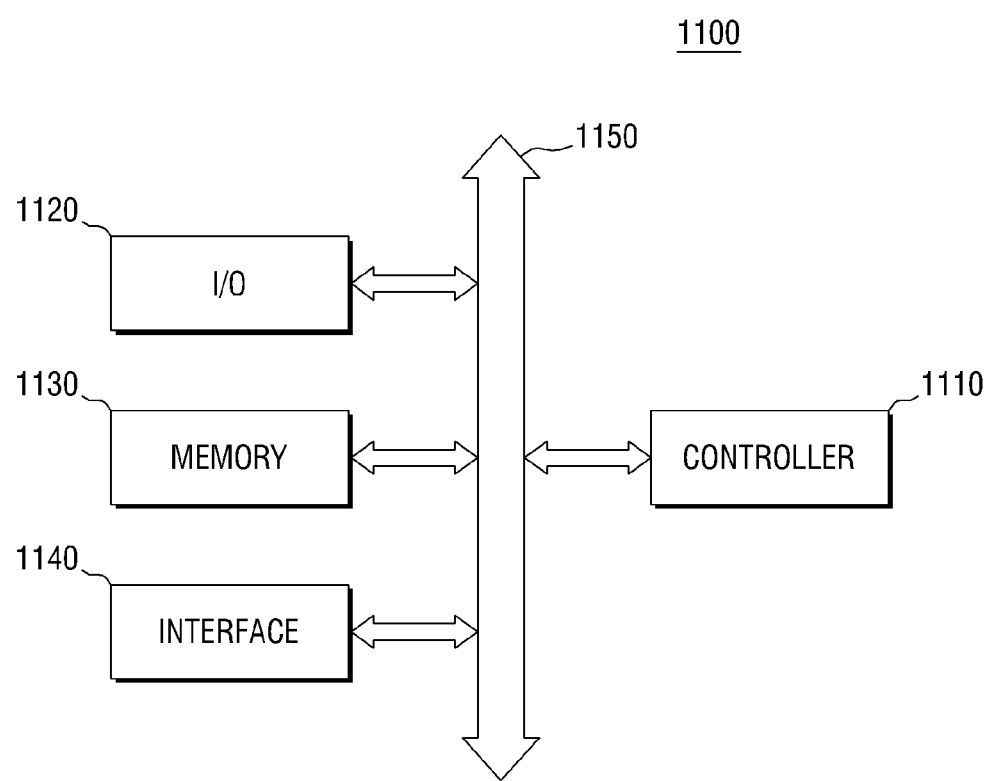
FIG. 27 is a block diagram of an electronic system including a semiconductor device fabricated by a method according to inventive concept.

Next, an example of an electronic system including a semiconductor device manufactured according to the inventive concept will be described with reference to FIG. 27.

The electronic system 1100 includes a controller 1110, an input/output device (I/O) 1120, a memory device 1130, an interface 1140 and a bus 1150. The controller 1110, the I/O 1120, the memory device 1130, and/or the interface 1140 are connected to each other through the bus 1150. The bus 1150 provides a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or code. The interface 1140 may perform functions of transmitting data to a communication network or receiving data from the communication network. The interface 1140 may be wired or wireless. For example, the interface 1140 may include an antenna or a wired/wireless transceiver.

Although not shown, the electronic system 1100 may further include a high-speed DRAM and/or SRAM as the working memory for improving the operation of the controller 1110. In this respect, the working memory may comprise a semiconductor device of FIGS. 22 and 23 fabricated according to inventive concept.

The electronic system 1100 is applicable to a personal digital assistant (PDA), a portable computer, a web tablet, a wireless phone, a mobile phone, a digital music player, a memory card, or any type of electronic device capable of transmitting and/or receiving information in a wireless environment.

Figure 28:
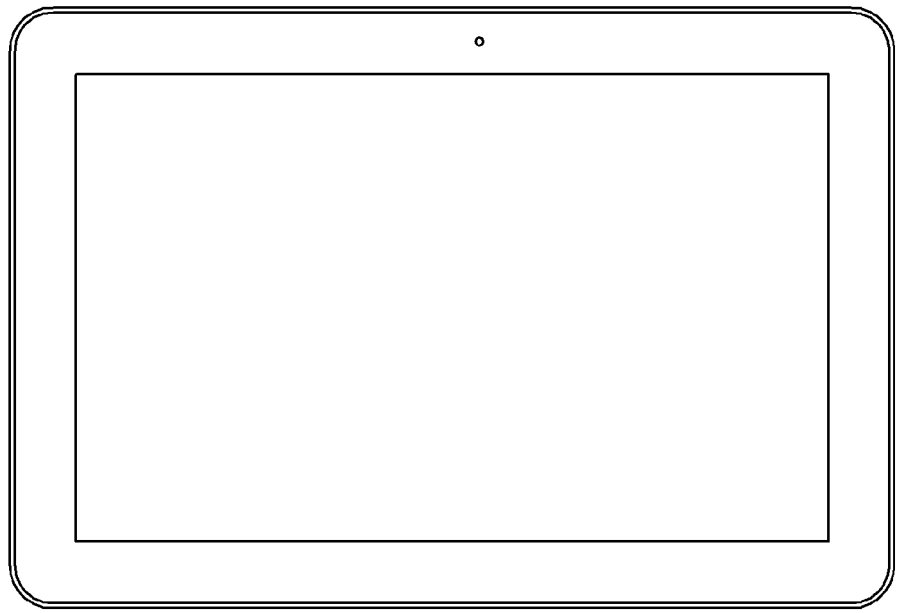
FIGS. 28, 29 and 30 are each a front view of an electronic device including a semiconductor device fabricated by a method according to the inventive concept.
Figure 29:
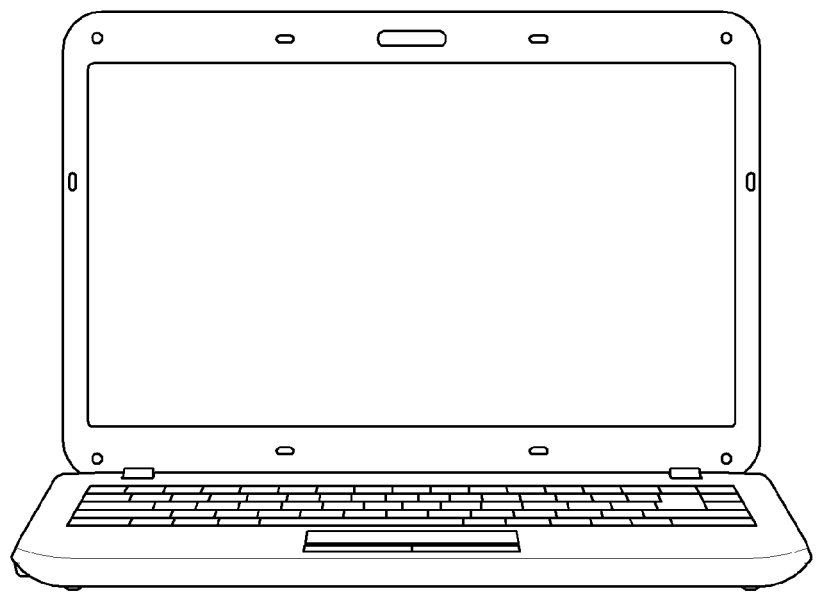
Figure 30:
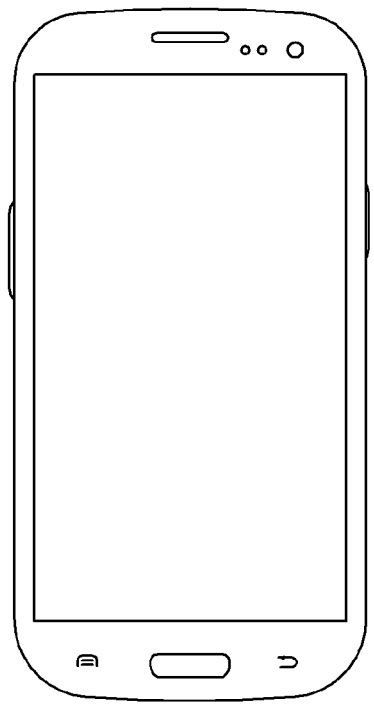

FIGS. 28 to 30 illustrate examples of electronic devices that may employ a semiconductor device fabricated by a method according to the inventive concept. FIG. 28 illustrates a tablet PC 1200, FIG. 29 illustrates a notebook computer 1300, and FIG. 30 illustrates a smart phone 1400.

It is apparent to those skilled in the art that the semiconductor devices fabricated by the method for fabricating the semiconductor device according to some embodiments of the inventive concept may be applied to other integrated circuit devices which are not illustrated.

That is, although an example of the semiconductor system according to the embodiment includes only the tablet PC 1200, the notebook computer 1300, and the smart phone 1400, the example of the semiconductor system according to the embodiment is not limited thereto.

Further, in some embodiments of the inventive concept, the semiconductor system may be implemented by a computer, an ultra mobile PC (UMPC), a workstation, a net-book, personal digital assistants (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, and the like.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a semiconductor device, the method comprising:
    forming an interface layer on a substrate;
    forming a first gate insulating layer having a first dielectric constant on the interface layer;
    forming a second gate insulating layer having a second dielectric constant smaller than the first dielectric constant on the first gate insulating layer;
    annealing the substrate;
    nitriding the first and second gate insulating layers to form a nitride gate insulator;
    forming a work function control layer on the nitrided gate insulator; and
    forming a metal gate electrode on the work function control layer, and
    wherein at least one of the work function control layer and the metal gate electrode comprises aluminum (Al).

2. The method of claim 1, wherein the interface layer and the second gate insulating layer are formed of the same oxide.

3. The method of claim 1, wherein the second gate insulating layer is formed of a silicon oxide.

4. The method of claim 3, wherein the first gate insulating layer is formed of a hafnium oxide.

5. The method of claim 1, wherein:
    the first gate insulating layer is formed by n cycles of an atomic layer deposition process, wherein n is a natural number, and
    the second gate insulating layer is formed by m cycles of an atomic layer deposition process, wherein m is a natural number less than n.

6. The method of claim 1, further comprising:
forming a third gate insulating layer, of the same material as the first gate insulating layer, on the second gate insulating layer; and
forming a fourth gate insulating layer of the same material as the second gate insulating layer on the third gate insulating layer.

7. The method of claim 6, wherein:
the first gate insulating layer is formed by n cycles of a first atomic layer deposition process, wherein n is a natural number,
the second gate insulating layer is formed by m cycles of a second atomic layer process, wherein m is a natural number less than n,
the third gate insulating layer is formed by m cycles of the first atomic layer deposition process, and
the fourth gate insulating layer is formed by m cycles of the second atomic layer deposition process.

8. The method of claim 1, wherein the annealing of the substrate includes flash, spike, or laser annealing the substrate at 800 to 1200° C.

9. The method of claim 1, wherein the nitriding of first and second gate insulating layers is carried out in an atmosphere comprising a nitride gas whose pressure is maintained in a range of 100 millitorr to 500 millitorr.

10. The method of claim 1, further comprising:
forming a capping layer on the first and second gate insulating layers; and
forming a barrier layer on the capping layer, and
wherein the work function control layer is formed on the barrier layer.

11. The method of claim 10, wherein:
the capping layer is formed of TiN,
the barrier layer is formed of TaN, and
the work function control layer is formed of at least one of TiN and TaN.

12. The method of claim 10, wherein the forming of the work function control layer includes:
forming a p type work function control layer in first and second regions,
removing the p type work function control layer from the first region, and
forming an n type work function control layer in the first and second regions.

13. The method of claim 1, further comprising:
forming an interlayer insulating layer and a dummy gate electrode on the substrate; and
exposing the surface of the substrate by removing the dummy gate electrode, and
wherein the interface layer is formed on the exposed surface of the substrate.

14. A method of fabricating a semiconductor device, the method comprising:
forming an interface layer on a substrate;
forming a first gate insulating layer having a first dielectric constant on the interface layer, and
forming a second gate insulating layer having a second dielectric constant smaller than the first dielectric constant and including silicon (Si) on the first gate insulating layer;
annealing the substrate;
nitriding the first and second gate insulating layers after annealing the substrate, in an atmosphere comprising a nitride gas;
forming a work function control layer on the nitrided gate insulating layers; and
forming a metal gate electrode on the work function control layer.

15. The method of claim 14, further comprising repeating processes used to form the first and second gate insulating layers, respectively, to form at least third and fourth gate insulating layers on the second gate insulating layer.

16. The method of claim 14, wherein:
the first gate insulating layer is formed of a hafnium oxide, and
the second gate insulating layer is formed of a silicon oxide.

17. The method of claim 14, wherein at least one of the work function control layer and the metal gate electrode comprises aluminum (Al).

18. A method of fabricating a semiconductor device, the method comprising:
providing a substrate;
forming a first interface layer on the substrate in a first region;
forming a second interface layer, having a width different from that of the first interface layer, on the substrate in the second region;
forming a first gate insulator doped with silicon (Si) on the first interface layer;
forming a second gate insulator doped with silicon (Si) on the second interface layer;
annealing the substrate;
nitriding the first gate insulator so that the first gate insulator has a first nitrogen concentration and nitriding the second gate insulator so that the second gate insulator has a second nitrogen concentration different from the first nitrogen concentration, after the annealing of the substrate;
forming a work function control layer on the first and second gate insulators after nitriding the first and second gate insulators; and
forming a metal gate electrode on the work function control layer.

19. The method of claim 18, wherein:
the first and second interface layers are formed such that the first interface layer is narrower than the second interface layer, and
the nitriding is carried out such that the first nitrogen concentration is higher than the second nitrogen concentration.

* * * * *